US008576890B2

(12) United States Patent
Fattal et al.

(10) Patent No.: US 8,576,890 B2
(45) Date of Patent: Nov. 5, 2013

(54) VERTICAL-CAVITY SURFACE-EMITTING LASER

(75) Inventors: David A. Fattal, Mountain View, CA (US); Raymond G. Beausoleil, Redmond, WA (US); Sagi Varghese Mathai, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 304 days.

(21) Appl. No.: 12/767,474

(22) Filed: Apr. 26, 2010

(65) Prior Publication Data

US 2011/0261856 A1    Oct. 27, 2011

(51) Int. Cl.
*H01S 5/00*    (2006.01)

(52) U.S. Cl.
USPC ............... 372/50.11; 372/46.011; 372/50.124

(58) Field of Classification Search
USPC ...................................................... 372/50.11
See application file for complete search history.

(56) References Cited

U.S. PATENT DOCUMENTS

| 6,741,624 | B2 | 5/2004 | Mears et al. | |
|---|---|---|---|---|
| 7,096,498 | B2 | 8/2006 | Judge | |
| 7,386,205 | B2 * | 6/2008 | Wang et al. | 385/37 |
| 2002/0073338 | A1 | 6/2002 | Burrows et al. | |
| 2003/0048824 | A1 * | 3/2003 | Shinagawa et al. | 372/46 |
| 2003/0235370 | A1 * | 12/2003 | Taillaert et al. | 385/50 |
| 2005/0013334 | A1 | 1/2005 | Watanabe et al. | |
| 2007/0153860 | A1 * | 7/2007 | Chang-Hasnain et al. | 372/50.124 |

OTHER PUBLICATIONS

Francesco Marino et al., "Single Mode Operation and Transverse Mode Control in VCSELs Induced by Frequency Selective Feedback", 3 pages, Dept. de Fisica Interdisciplinar, Instituto Mediteraneo de Estudios Avanzados (CSIC-UIB), C/Miquel Marques 21, E-07190 Esporles, Spain.

Ye Zhou et al., "Transverse Mode Control in High-Contrast Subwavelength Grating VCSEL", 2 pages, Dept. of Electrical Engineering and Computer Sciences, University of California, Berkeley, USA, May 6-11, 2007.

David Fattal et al., "Flat Dielectric Grating Reflectors with High Focusing Power", 8 pages, <http://arvix.org/PScache/arxiv/pdf/1001/1001.3711v1.pdf>, Jan. 21, 2010.

\* cited by examiner

*Primary Examiner* — Xinning Niu

(57) ABSTRACT

A VCSEL includes a grating layer configured with a non-periodic, sub-wavelength grating, in which the non-periodic, sub-wavelength grating includes at least one first section configured to have a relatively low reflection coefficient and at least one second section configured to have a relatively high reflection coefficient to cause light to be reflected in a predetermined, non-Gaussian, spatial mode across the sub-wavelength grating. The VCSEL also includes a reflective layer and a light emitting layer disposed between the grating layer and the reflector, in which the sub-wavelength grating and the reflector form a resonant cavity.

20 Claims, 21 Drawing Sheets

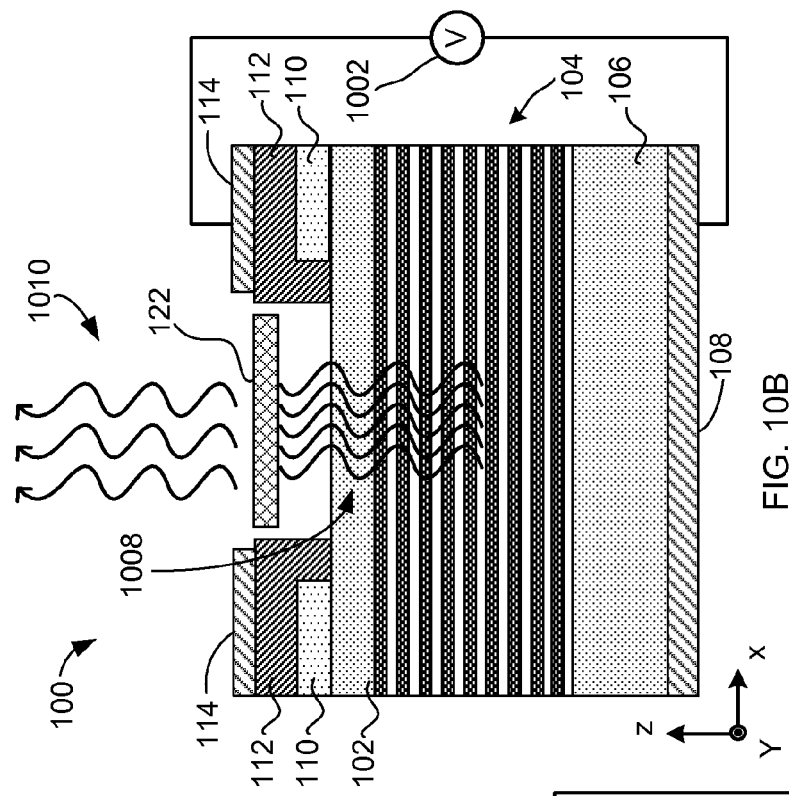
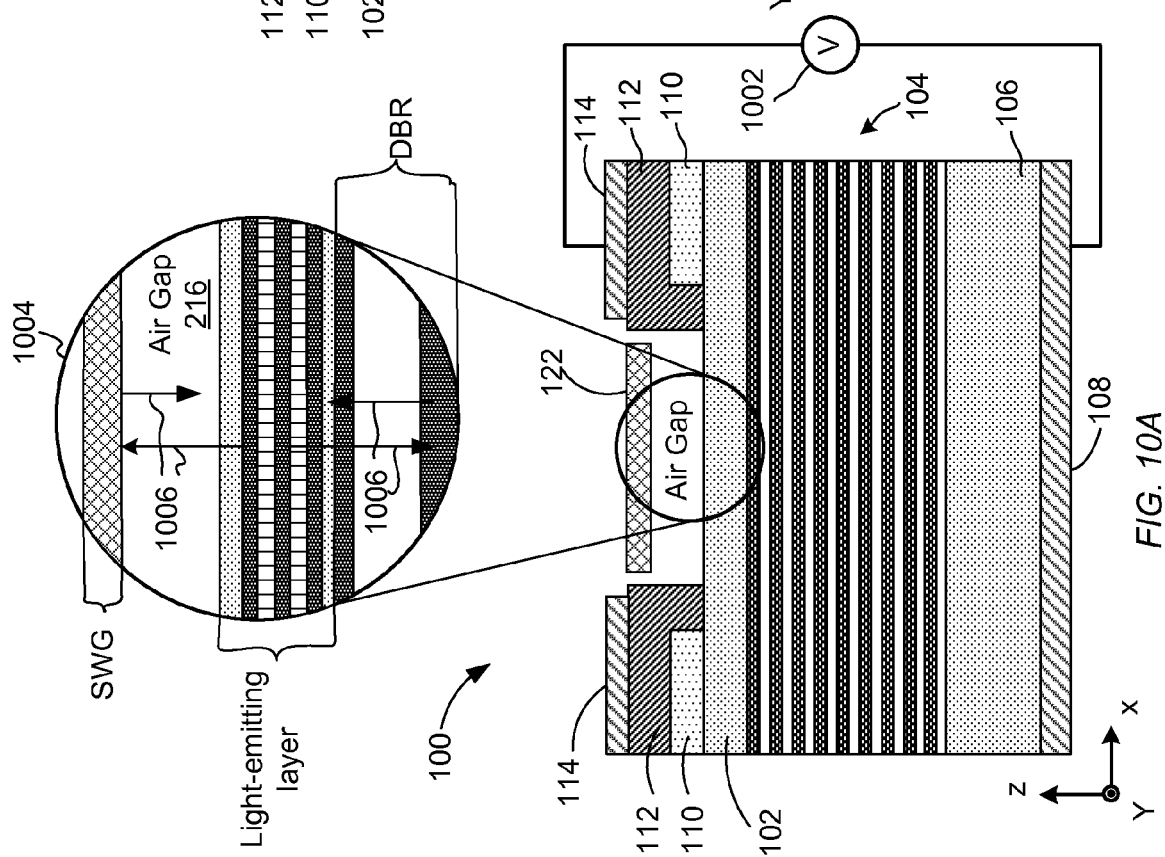
FIG. 10A
FIG. 10B

VERTICAL-CAVITY SURFACE-EMITTING LASER

CROSS-REFERENCE TO RELATED APPLICATIONS

The present application has the same Assignee and shares some common subject matter with PCT Application No. PCT/US2009/051026, entitled "NON-PERIODIC GRATING REFLECTORS WITH FOCUSING POWER AND METHODS FOR FABRICATING THE SAME", filed on Jul. 17, 2009, PCT Application Serial No. PCT/US2009/058006, entitled "OPTICAL DEVICES BASED ON DIFFRACTION GRATINGS", filed on Sep. 23, 2009, and U.S. patent application Ser. No. 12/696,682, entitled "DYNAMICALLY VARYING AN OPTICAL CHARACTERISTIC OF A LIGHT BEAM", filed on Jan. 29, 2010, PCT Application No. 10/22632, filed on Jan. 29, 2010, entitled "VERTICAL-CAVITY SURFACE-EMITTING LASERS WITH NON-PERIODIC GRATINGS", the disclosures of which are hereby incorporated by reference in their entireties.

BACKGROUND

Semiconductor lasers represent one of the most important class of lasers in use today because they can be used in a wide variety of applications including displays, solid-state lighting, sensing, printing, and telecommunications just to name a few. The two types of semiconductor lasers primarily in use are edge-emitting lasers and surface emitting lasers. Edge-emitting lasers generate light traveling in a direction substantially parallel to the light emitting layer. On the other hand, surface-emitting lasers generate light traveling normal to the light-emitting layer. Surface-emitting layers have a number of advantages over typical edge-emitting lasers: they emit light more efficiently and can be arranged to form two-dimensional, light-emitting arrays.

Surface-emitting lasers configured with the light-emitting layer sandwiched between two reflectors are referred to as vertical-cavity surface-emitting lasers ("VCSELs"). The reflectors are typically distributed Bragg reflectors ("DBRs") that ideally form a reflective cavity with greater than 99% reflectivity for optical feedback. DBRs are composed of multiple alternating layers, each layer composed of a dielectric or semiconductor material with periodic refractive index variation. Two adjacent layers within a DBR have different refractive indices and are referred to as "DBR pairs." DBR reflectivity and bandwidth depend on the refractive-index contrast of constituent materials of each layer and on the thickness of each layer. The materials used to form DBR pairs typically have similar compositions and, therefore, have relatively small refractive-index differences. Thus, in order to achieve a cavity reflectivity of greater than 99%, and provide a narrow mirror bandwidth, DBRs are configured with anywhere from about 15 to about 40 or more DBR pairs. However, fabricating DBRs with greater than 99% reflectivity has proven to be difficult, especially for VCSELs designed to emit light with wavelengths in the blue-green and long-infrared portions of the electromagnetic spectrum.

BRIEF DESCRIPTION OF THE DRAWINGS

Embodiments are illustrated by way of example and not limited in the following figure(s), in which like numerals indicate like elements, in which:

FIGS. 10A-10B show cross-sectional views of the resonant cavity of the VCSEL depicted in FIG. 1A, according to an embodiment of the invention;

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein are embodiments directed to vertical-cavity surface-emitting laser (VCSEL) arrays, where each VCSEL lases light in a predetermined, non-Gaussian, spatial mode. More particularly, for instance, each of the VCSELs is configured in various respects to emit light having a predefined pattern. In this regard, each VCSEL within the VCSEL array includes a non-periodic, sub-wavelength grating ("SWG") and a distributed Bragg reflector ("DBR") that form an optical cavity. The SWG of each VCSEL comprises a plurality of patterns that reflect light in a predetermined, non-Gaussian, spatial mode across the sub-wavelength grating. More particularly, the SWG of each of VCSEL includes at least one first section composed of a pattern configured to have a relatively low reflection coefficient and at least one second section composed of a pattern configured to have a relatively high reflection coefficient to thereby cause light to be reflected in a non-Gaussian, spatial mode across the SWGs. By way of particular example, the first section(s) are configured to have a reflectivity level of between about 50%-70% and the second section(s) are configured to have a reflectivity level of about 99%. In other examples, the first section(s) are configured to have reflectivity levels of less than 50%.

The SWG of each VCSEL may be configured to control the pattern of the internal cavity modes and the pattern of the external modes emitted from the VCSEL. Each VCSEL has a relatively small mode volume, an approximately single spatial output mode, emits light over a relatively narrow wavelength range, and may be configured to emit light with a single polarization.

In the following description, the term "light" refers to electromagnetic radiation with wavelengths in the visible and non-visible portions of the electromagnetic spectrum, including infrared and ultra-violet portions of the electromagnetic spectrum.

Figure 1A:
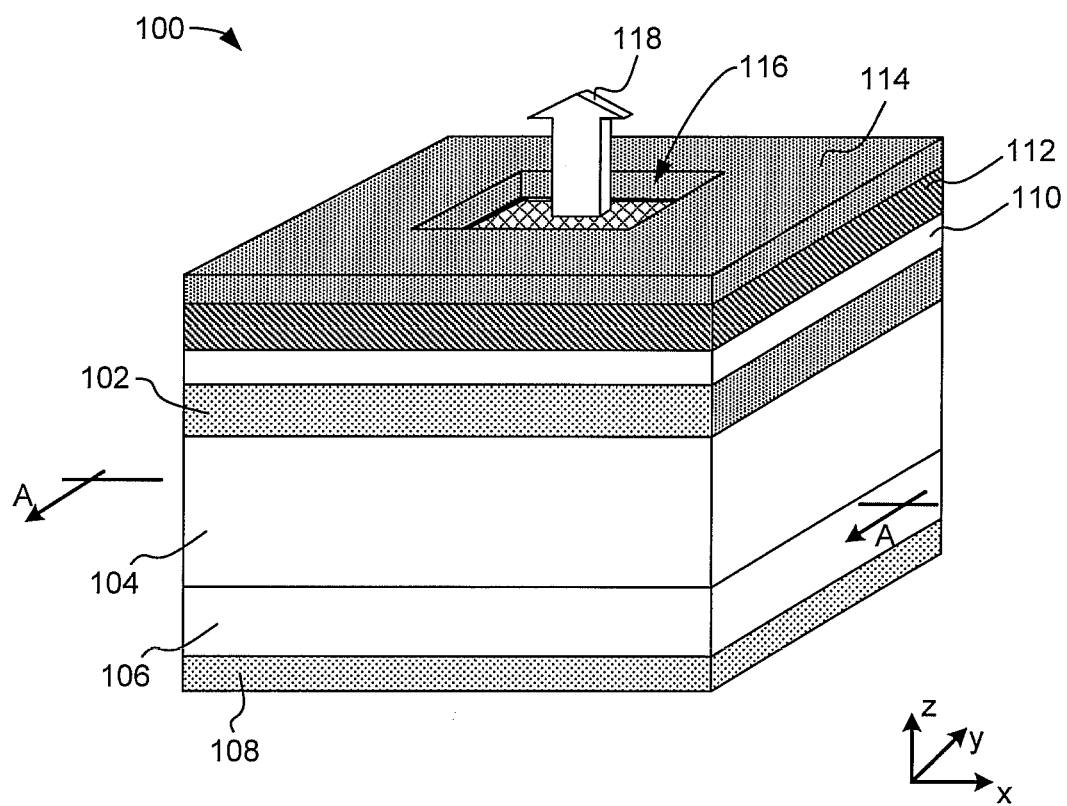
FIGS. 1A and 1B, respectively, show an isometric view and an exploded isometric view of an example VCSEL, according to an embodiment of the invention.

With reference first to FIG. 1A, there is shown an isometric view of an example VCSEL 100 configured in accordance with one or more embodiments of the present invention. It should be understood that the VCSEL 100 depicted in FIG. 1A may include additional components and that some of the components described herein may be removed and/or modified without departing from a scope of the VCSEL 100.

As depicted in FIG. 1A, the VCSEL 100 includes a light-emitting layer 102 disposed on a distributed Bragg reflector ("DBR") 104. The DBR 104 is in turn disposed on a substrate 106 which is disposed on a first electrode 108. The VCSEL 100 also includes an insulating layer 110 disposed on the light-emitting layer 102, a grating layer 112 disposed on the insulating layer 110, and a second electrode 114 disposed on the grating layer 112. As shown in the example of FIG. 1A, the second electrode 114 is configured with a rectangular-shaped opening 116 exposing a portion of the grating layer 112. The opening 116 allows light emitted from the light emitting layer 102 to exit the VCSEL 100 substantially perpendicular to the xy-plane of the layers, as indicated by directional arrow 118 (i.e., light is emitted from the VCSEL 100 through the opening in the z-direction). As discussed in greater detail herein below, the grating layer 112 is composed of various sections having differing levels of reflectivity to thereby cause the light emitted through the opening 116 to have a predetermined pattern.

Figure 1B:
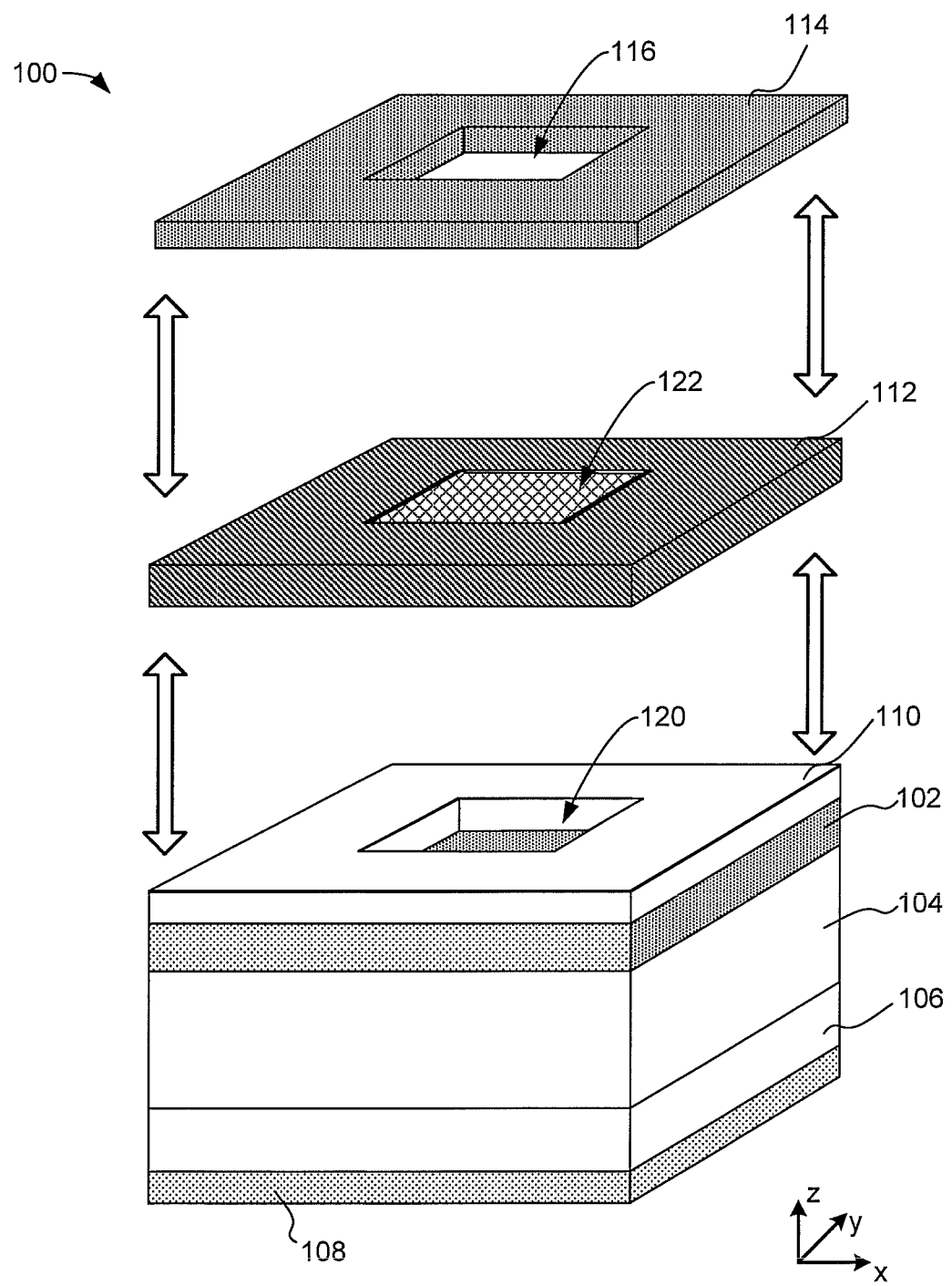

FIG. 1B shows an exploded isometric view of the VCSEL 100 depicted in FIG. 1A configured in accordance with one or more embodiments of the present invention. The isometric view reveals an opening 120 in the insulating layer 110 and a SWG 122 in the grating layer 112. The opening 120 allows light emitted from the light-emitting layer 102 to reach the SWG 122. Note that embodiments of the present invention are not limited to the openings 116 and 120 being rectangular shaped. In other embodiments, the openings in the second electrode and the insulating layer may be square, circular, elliptical or any other suitable shape.

The layers 104, 106, and 112 are composed of various combinations of suitable compound semiconductor materials. Compound semiconductors include III-V compound semiconductors and II-VI compound semiconductors. III-V compound semiconductors are composed of column IIIa elements selected from boron ("B"), aluminum ("Al"), gallium ("Ga"), and indium ("In") in combination with column Va elements selected from nitrogen ("N"), phosphorus ("P"), arsenic ("As"), and antimony ("Sb"). III-V compound semiconductors are classified according to the relative quantities of III and V elements, such as binary compound semiconductors, ternary compound semiconductors, and quaternary compound semiconductors. For example, binary semiconductor compounds include, but are not limited to, GaAs, GaAl, InP, InAs, and GaP; ternary compound semiconductors include, but are not limited to, $Al_yGa_{1-y}As$, $In_yGa_{y-1}As$ or $GaAs_yP_{1-y}$, where y ranges between 0 and 1; and quaternary compound semiconductors include, but are not limited to, $In_xGa_{1-x}As_yP_{1-y}$, where both x and y independently range between 0 and 1. II-VI compound semiconductors are composed of column IIb elements selected from zinc ("Zn"), cadmium ("Cd"), mercury ("Hg") in combination with Via elements selected from oxygen ("O"), sulfur ("S"), and selenium ("Se"). For example, suitable 11-VI compound semiconductors includes, but are not limited to, CdSe, ZnSe, ZnS, and ZnO are examples of binary II-VI compound semiconductors.

The layers of the VCSEL 100 may be formed using molecular beam epitaxy, chemical vapor deposition, physical vapor deposition, wafer bonding, etc. The SWG 122 may be formed in the grating layer 112 using reactive ion etching, focusing beam milling, nanoimprint lithography, etc., and the grating layer 112 may be bonded to the insulating layer 110.

In certain embodiments, the layers 104 and 106 are doped with a p-type impurity while the grating layer 112 is doped with an n-type impurity. In other embodiments, the layers 104 and 106 are doped with an n-type impurity while the grating layer 112 is doped with a p-type impurity. P-type impurities are atoms incorporated into the semiconductor lattice that introduce vacant electronic energy levels called "holes" to the electronic band gaps of the layers. These dopants are also called "electron acceptors." On the other hand, n-type impurities are atoms incorporated into the semiconductor lattice that introduce filled electronic energy levels to the electronic band gaps of the layers. These dopants are called "electron donors." In III-V compound semiconductors, column VI elements substitute for column V atoms in the III-V lattice and serve as n-type dopants, and column II elements substitute for column III atoms in the III-V lattice to serve as p-type dopants.

The insulating layer 110 may be composed of an insulating material, such as $SiO_2$ or $Al_2O_3$ or another suitable material having a large electronic band gap. The electrodes 108 and 114 may be composed of a suitable conductor, such as gold ("Au"), silver ("Ag"), copper ("Cu"), or platinum ("Pt").

Figure 2:
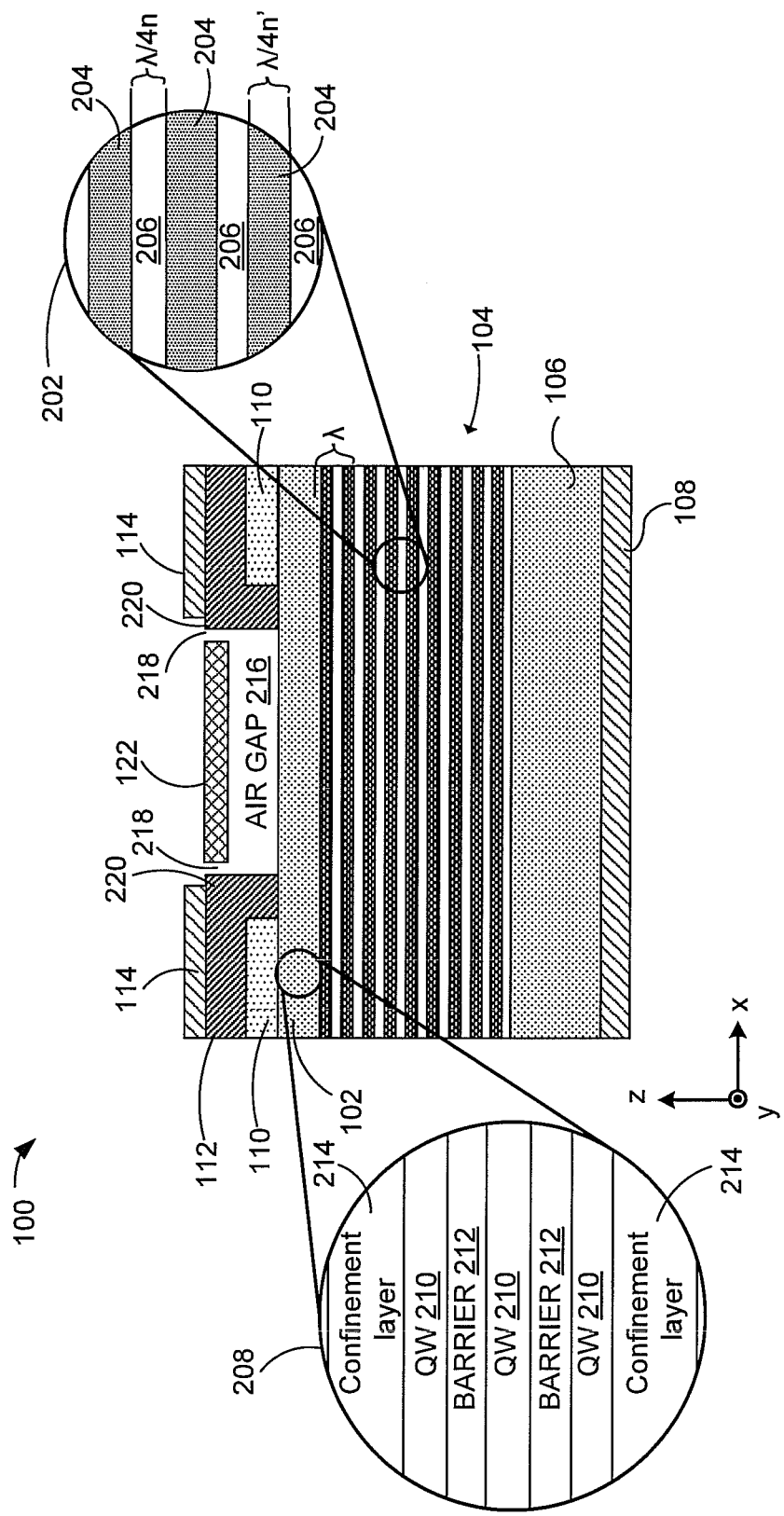
FIG. 2 shows a cross-sectional view of the VCSEL shown in FIG. 1A along a line A-A, according to an embodiment of the invention.

FIG. 2 shows a cross-sectional view of the VCSEL 100 along a line A-A, shown in FIG. 1A, in accordance with one or more embodiments of the present invention. The cross-sectional view reveals the structure of the individual layers. The DBR 104 is composed of a stack of DBR pairs oriented parallel to the light-emitting layer 102. In practice, the DBR 104 may be composed of about 15 to about 40 or more DBR pairs. Enlargement 202 of a sample portion of the DBR 104 reveals that the layers of the DBR 104 each have a thickness of about $\lambda/4n$ and $\lambda/4n'$, where $\lambda$ is the desired vacuum wavelength of light emitted from the light-emitting layer 102, and n is the index of refraction of the DBR layers 206 and n' is the index of refraction of the DBR layers 204. Dark shaded layers 204 represent DBR layers composed of a first semiconductor material, and light shaded layers 206 represent DBR layers composed of a second semiconductor material with the layers 204 and 206 having different associated refractive indices. For example, layers 204 may be composed of GaAs, which has an approximate refractive index of 3.6, layers 206 may be composed AlAs, which has an approximate refractive index of 2.9, and the substrate may be composed of GaAs or AlAs.

FIG. 2 also includes an enlargement 208 of the light-emitting layer 102 that reveals one or many possible configurations for the layers comprising the light-emitting layer 102. Enlargement 208 reveals the light-emitting layer 102 is composed of three separate quantum-well layers ("QW") 210 separated by barrier layers 212. The QWs 210 are disposed between confinement layers 214. The material comprising the QWs 210 has a smaller electronic band gap than the barrier layers 212 and confinement layers 214. The thickness of the confinement layers 214 may be selected so that the overall thickness of the light-emitting layer 102 is approximately the wavelength of the light emitted from the light-emitting layer 102. The layers 210, 212, and 214 are composed of different intrinsic semiconductor materials. For example, the QW layers 210 may be composed of InGaAs (e.g., $In_{0.2}Ga_{0.8}As$), the barrier layers 212 may be composed of GaAs, and the confinement layers may be composed of GaAlAs. Embodiments of the present invention are not limited to the light-emitting layer 102 having three QWs. In other embodiments, the light-emitting layer may have one, two, or more than three QWs.

FIG. 2 also reveals the configuration of the grating layer 112. As shown therein, the SWG 122 is thinner than the rest of the grating layer 112 and is suspended above the light-emitting layer 102 in order to create an air gap 216 between the SWG 122 and the light-emitting layer 102. As shown in FIG. 2, and in FIG. 1B, the SWG 122 may be attached to the grating layer 112 along one edge with air gaps 218 separating the three remaining edges of the SWG 122 from the grating layer 112. Alternatively, the SWG 122 may be attached to the grating layer 112 on two edges to form a bridge structure or on all four edges to form a membrane. The grating layer 112 and the insulating layer 110 are also configured so that portions 220 of the grating layer 112 are in contact with the light-emitting layer 102 through the opening 120 in the insulating layer 110. The insulating layer 110 constrains the flow of current through the portions 218 of the grating layer 112 to near the center of the light-emitting layer 102. The SWG 122 and the DBR 104 are the reflectors that form a reflective cavity for optical feedback during lasing of the VCSEL 100.

As described above, the SWG 122 of the grating layer 112 is implemented as a suspended membrane above of the light-emitting layer 102. A SWG 122 configured in accordance with one or more embodiments of the present invention provides reflective functionalities including control of the shape of the wavefront of the light reflected back into the cavity of the VCSEL 100 and control of the pattern of the wavefront and the pattern of the light emitting through the opening 116 in the second electrode 114, shown in FIG. 1A. This may be accomplished by configuring the SWG 122 with a non-periodic grating pattern that controls both the phase and pattern in the light reflected from the SWG 122, such that, certain sections of the SWG 122 are relatively more reflective than other sections of the SWG 122. In certain embodiments, as described below, the SWG 122 may be configured with sections having a relatively low reflection coefficient and sections having a relatively high reflection coefficient to thereby enable the SWG 122 to reflect light at various amplitudes across the surface of the SWG 122.

Figure 3A:
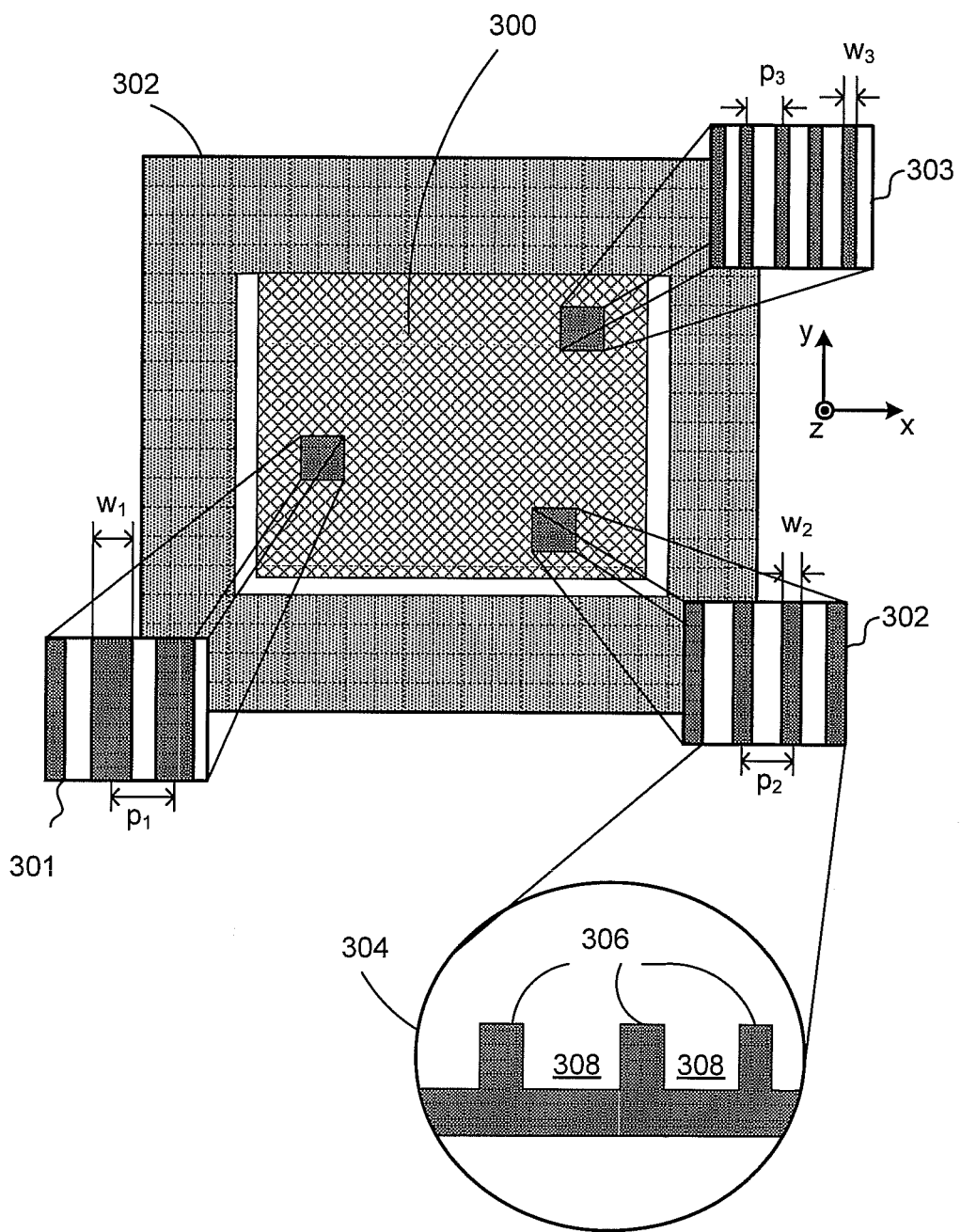
FIGS. 3A-3C illustrate respective top plan views of a sub-wavelength dielectric grating depicted in FIG. 2, according to embodiments of the invention.

FIG. 3A shows a top plan view of a SWG 300 configured with a one dimensional grating pattern formed in a grating layer 302 in accordance with one or more embodiments of the present invention. The one-dimensional grating pattern is composed of a number of sections containing one-dimensional grating sub-patterns arranged to reflect light at differing intensity levels. In the example of FIG. 3A, three grating sub-patterns 301-303 are enlarged. In the embodiment represented in FIG. 3A, each grating sub-pattern comprises a number of regularly spaced wire-like portions of the grating layer 102 material called "lines" formed in the grating layer 302. The lines extend in the y-direction and are periodically spaced in the x-direction. In other embodiments, the line spacing can be continuously varying to produce a desired pattern in the beams of light reflected/refracted by the SWG 300. FIG. 3A also includes an enlarged end-on view 304 of the grating sub-pattern 302. The lines 306 are separated by grooves 308. Each sub-pattern is characterized by a particular periodic spacing of the lines and by the line width in the x-direction. For example, the sub-pattern 301 comprises lines of width $w_1$ separated by a period $p_1$, the sub-pattern 302 comprises lines with width $w_2$ separated by a period $p_2$, and the sub-pattern 303 comprises lines with width $w_3$ separated by a period $p_3$.

The grating sub-patterns 301-303 form sub-wavelength gratings that preferentially reflect incident light polarized in one direction, i.e., the x-direction, provided the periods $p_1$, $p_2$, and $p_3$ are smaller than the wavelength of the incident light. For example, the lines widths may range from approximately 10 nm to approximately 300 nm and the periods can range from approximately 20 nm to approximately 1µm depending on the wavelength of the incident light. The light reflected from a region acquires a phase $\phi$ determined by the line thickness t, and the duty cycle $\eta$ defined as:

$$\eta = \frac{w}{p}$$

where w is the line width and p is the period spacing of the lines.

The SWGs 300 may be configured to apply a particular phase change to reflected light while maintaining sections that have a relatively low reflectivity level and sections that have a relatively high reflectivity level to thereby reflect the light in a predetermined pattern. The one-dimensional SWG 300 may be configured to reflect the x-polarized component or the y-polarized component of the incident light by adjusting the period, line width and line thickness of the lines. For example, a particular period, line width and line thickness may be suitable for reflecting the x-polarized component but not for reflecting the y-polarized component; and a different period, line width and line thickness may be suitable for reflecting the y-polarized component but not for reflecting the x-polarized component. In this regard, particular periods, line widths and line thicknesses may be selected for various sections of the SWG 302 to thereby control the pattern of the light reflected from the SWG 302.

Figure 3B:
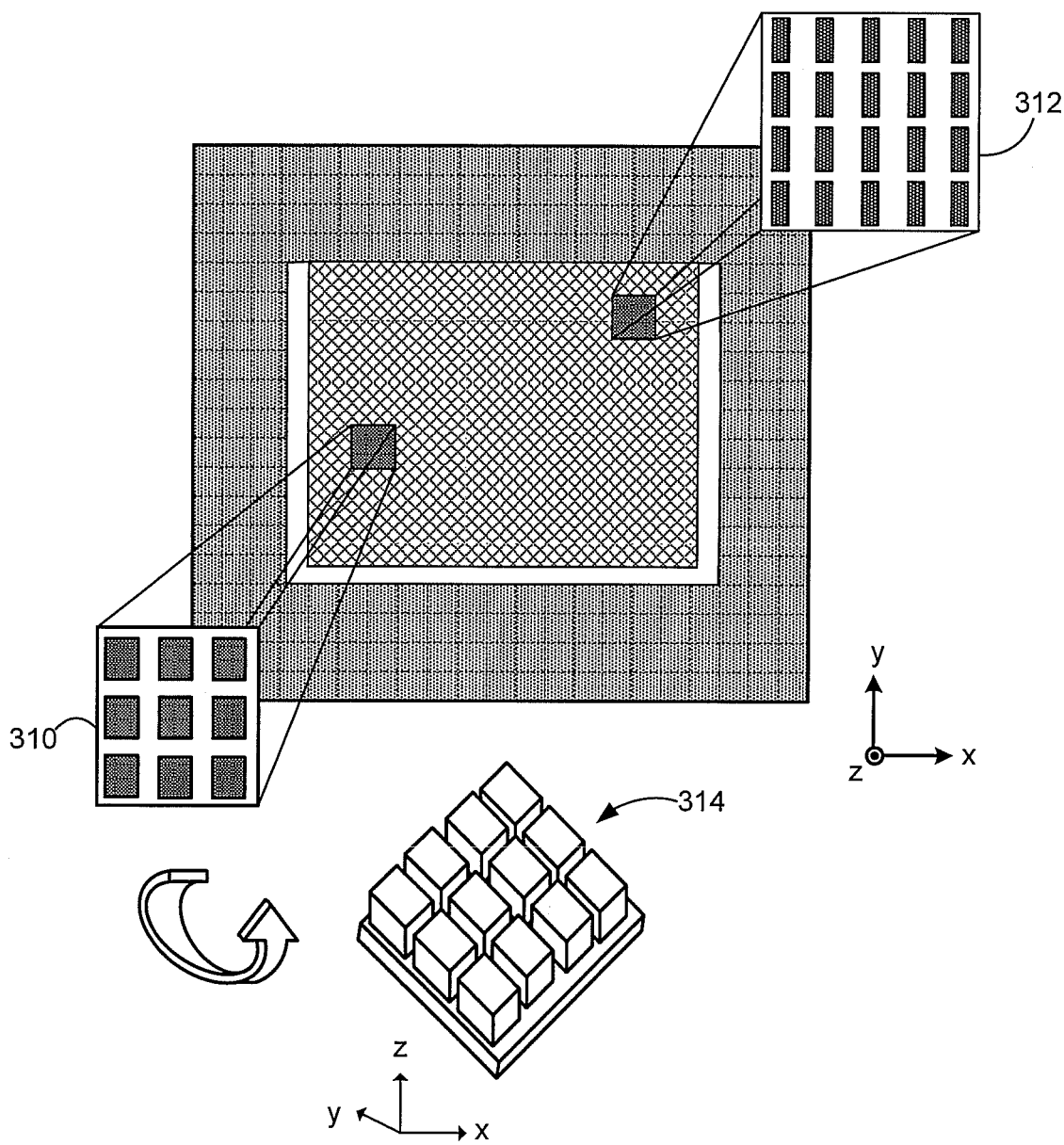
Figure 3C:
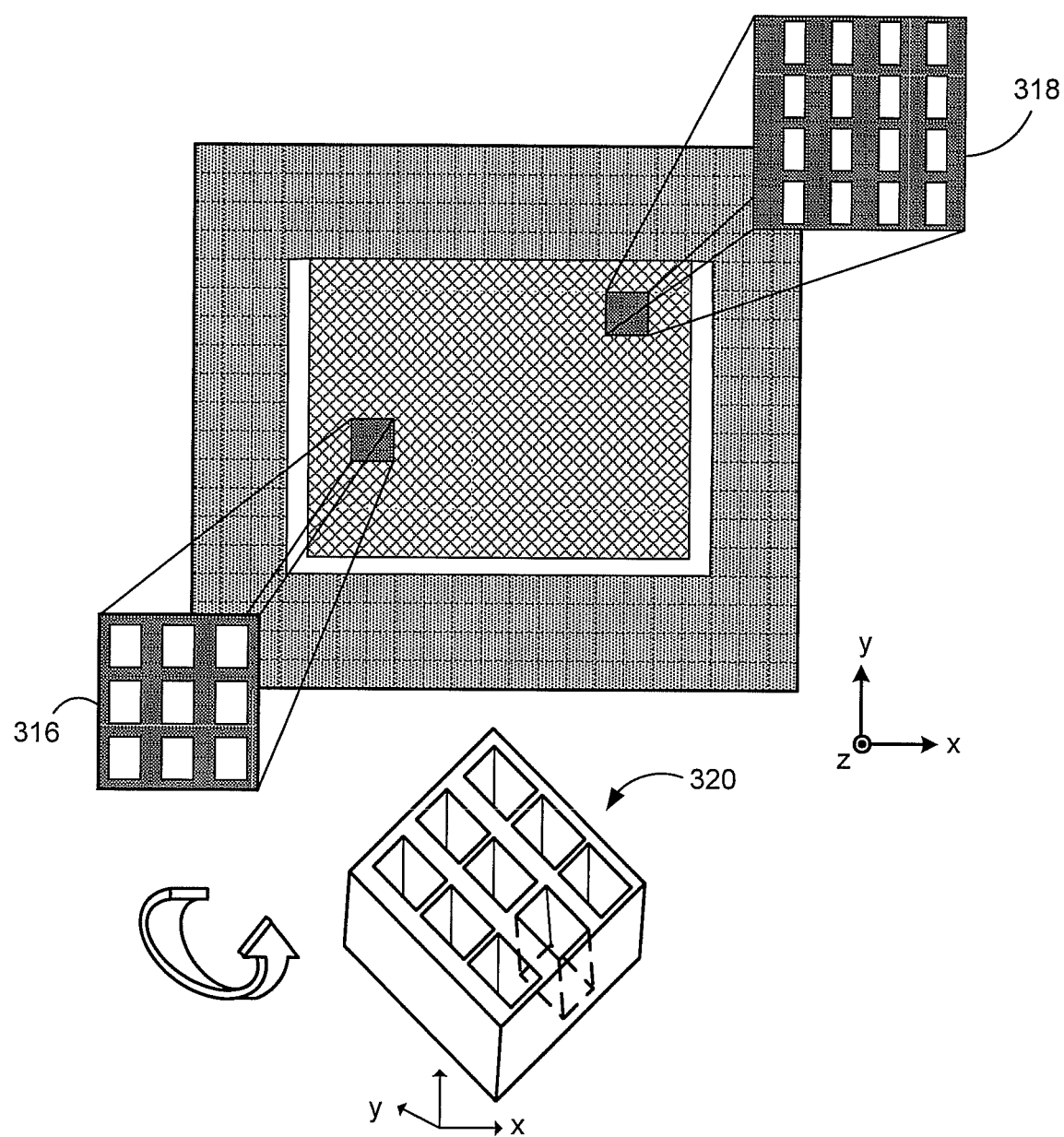

Embodiments of the present invention are not limited to one-dimensional gratings. A SWG may be configured with a two-dimensional, non-periodic grating pattern to reflect polarity insensitive light. FIGS. 3B-3C show top plan views of two example planar SWGs with two-dimensional sub-wavelength grating patterns in accordance with one or more embodiments of the present invention. In the example of FIG. 3B, the SWG is composed of posts rather lines separated by grooves. The duty cycle and period may be varied in the x- and y-directions. Enlargements 310 and 312 show two different post sizes. FIG. 3B includes an isometric view 314 of posts comprising the enlargement 310. Embodiments of the present invention are not limited to rectangular shaped posts, in other embodiments that posts may be square, circular, elliptical or any other suitable shape. In the example of FIG. 3C, the SWG is composed of holes rather than posts. Enlargements 316 and 318 show two different rectangular-shaped hole sizes. The duty cycle may be varied in the x- and y-directions. FIG. 3C includes an isometric view 320 comprising the enlargement 316. Although the holes shown in FIG. 3C are rectangular shaped, in other embodiments, the holes may be square, circular, elliptical or any other suitable shape.

In other embodiments, the line spacing, thickness, and periods may be continuously varying in both one- and two-dimensional grating patterns to produce a desired pattern in the reflected light.

Figure 4:
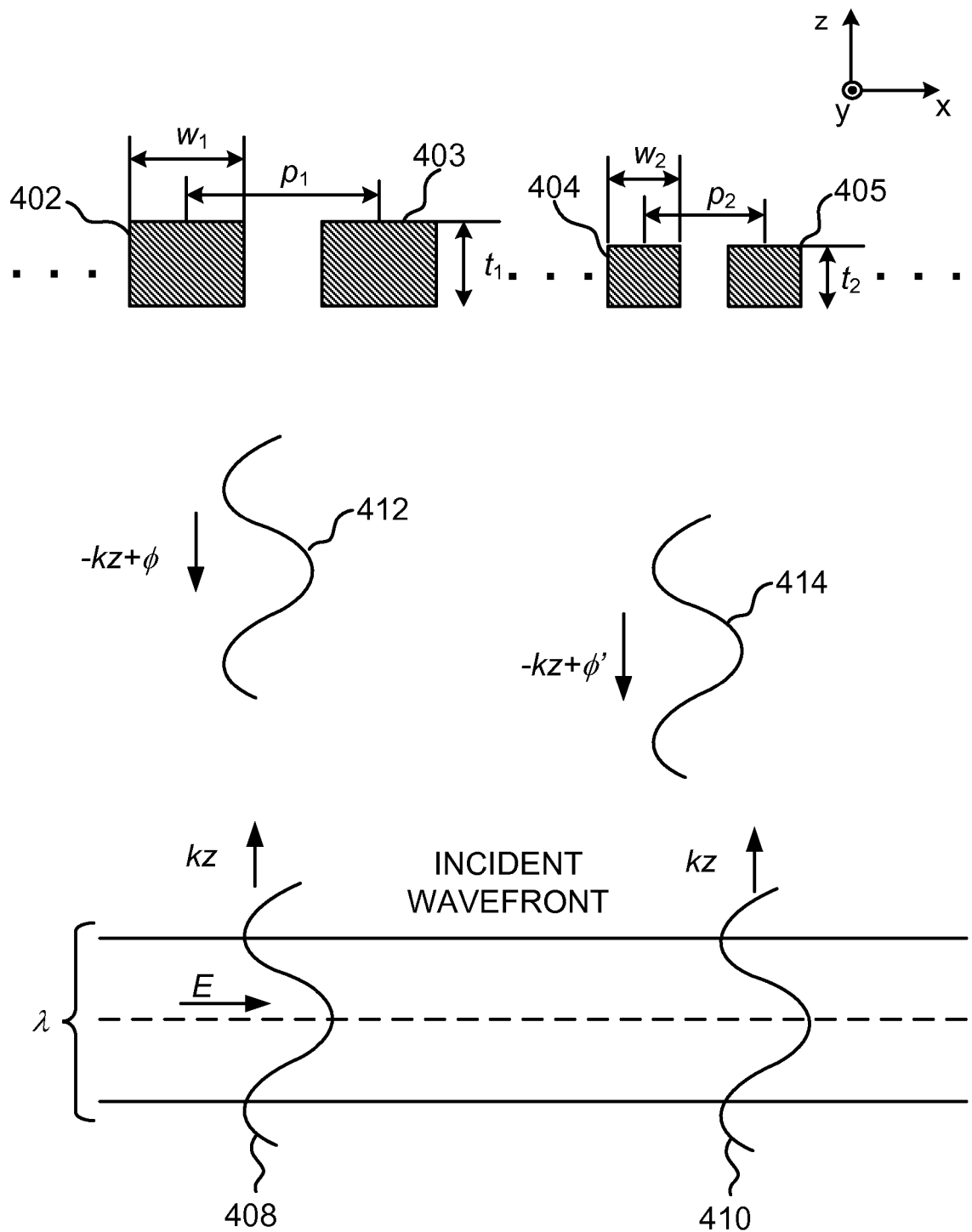
FIG. 4 shows a cross-sectional view of lines from two separate grating sub-patterns revealing the phase acquired by reflected light, according to an embodiment of the invention.

Each of the grating sub-patterns 301-303 also reflects incident light polarized in one direction, for instance, the x-direction, differently due to the different duty cycles and periods associated with each of the sub-patterns. FIG. 4 shows a cross-sectional view of lines from two separate grating sub-patterns revealing the phase acquired by reflected light in accordance with one or more embodiments of the present invention. For example, lines 402 and 403 may be lines in a first grating sub-pattern located in the SWG 400, and lines 404 and 405 may be lines in a second grating sub-pattern located elsewhere in the SWG 400. The thickness $t_1$ of the lines 402 and 403 is greater than the thickness $t_2$ of the lines 404 and 405, and the duty cycle $\eta_1$ associated with the lines 402 and 403 is also greater than the duty cycle $\eta_2$ associated with the lines 404 and 405. Light polarized in the x-direction and incident on the lines 402-405 becomes trapped by the lines 402 and 403 for a relatively longer period of time than the portion of the incident light trapped by the lines 404 and 405. As a result, the portion of light reflected from the lines 402 and 403 acquires a larger phase shift than the portion of light reflected from the lines 404 and 405. As shown in the example of FIG. 4, the incident waves 408 and 410 strike the lines 402-405 with approximately the same phase, but the wave 412 reflected from the lines 402 and 403 acquires a relatively larger phase shift $\phi$ than the phase $\phi'$ (i.e., $\phi > \phi'$) acquired by the wave 414 reflected from the lines 404 and 405. By controlling the phase shifts of the lines 402-405, the level of reflectivity at various sections of the SWG 122 may also be controlled.

Figure 5:
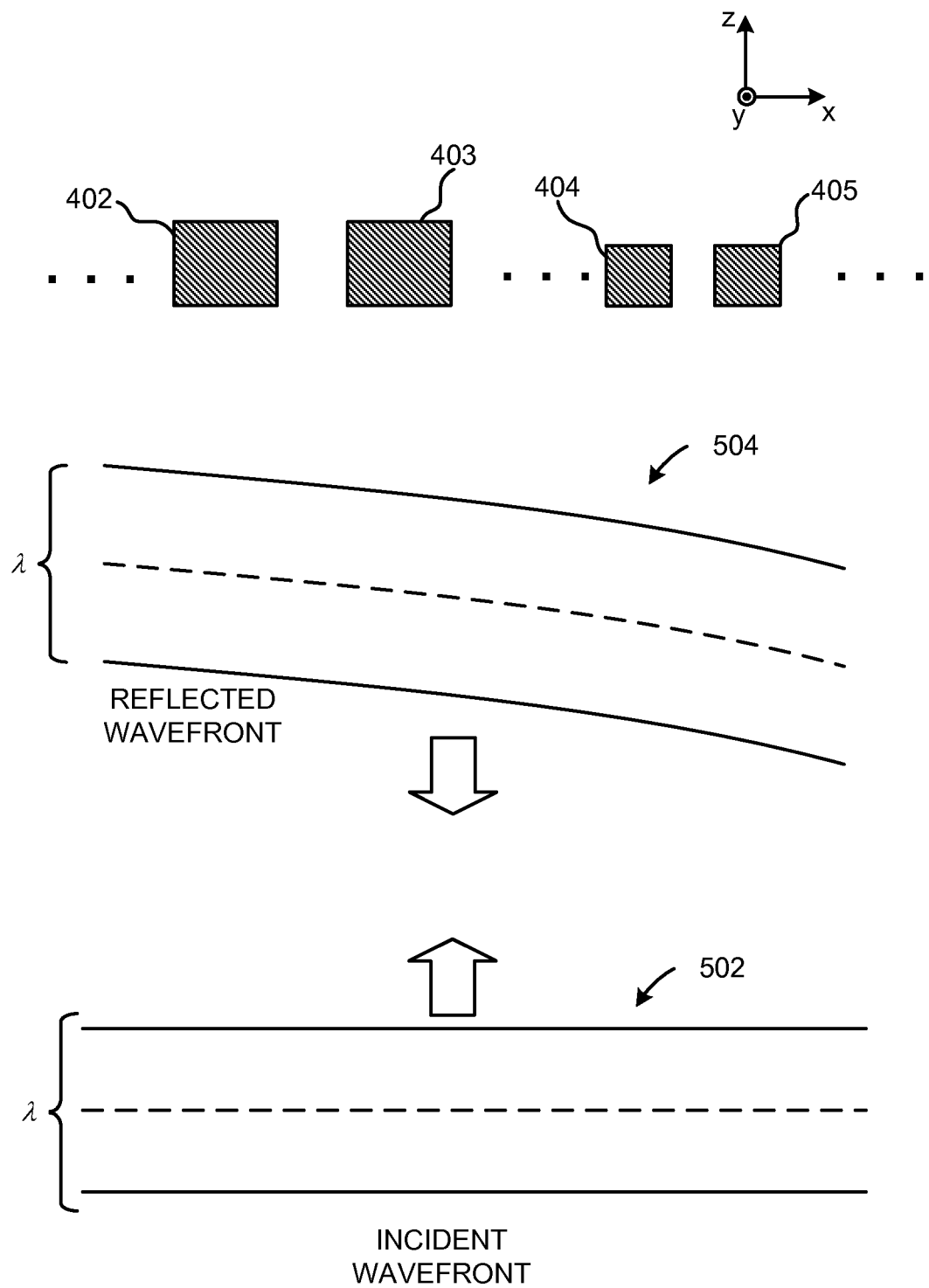
FIG. 5 shows a cross-sectional view of the lines revealing how the reflected wavefront changes, according to an embodiment of the invention.

FIG. 5 shows a cross-sectional view of the lines 402-405 revealing how the reflected wavefront changes in accordance with one or more embodiments of the present invention. As shown in the example of FIG. 5, incident light with a substantially uniform wavefront 502 strikes the lines 402-405 producing reflected light with a curved reflected wavefront 504. The curved reflected wavefront 504 results from portions of the incident wavefront 502 interacting with the lines 402 and 403 with a relatively larger duty cycle $\eta_1$ and thickness $t_1$ than portions of the same incident wavefront 502 interacting with the lines 404 and 405 with a relatively smaller duty cycle $\eta_2$ and thickness $t_2$. The shape of the reflected wavefront 504 is consistent with the larger phase acquired by light striking the lines 402 and 403 relative to the smaller phase acquired by light striking the lines 404 and 405.

By varying the duty cycle and thicknesses of the lines 402-405 with respect to each other, the reflected wavefront may be controlled to have relatively complex patterns. For instance, the lines 402-405 may be designed and configured to have a ring shape by causing the lines 402-405 near the center of the SWG 300 to be configured to be less reflective than the lines 402-405 positioned outside of the center area of the SWG 300.

Figure 6:
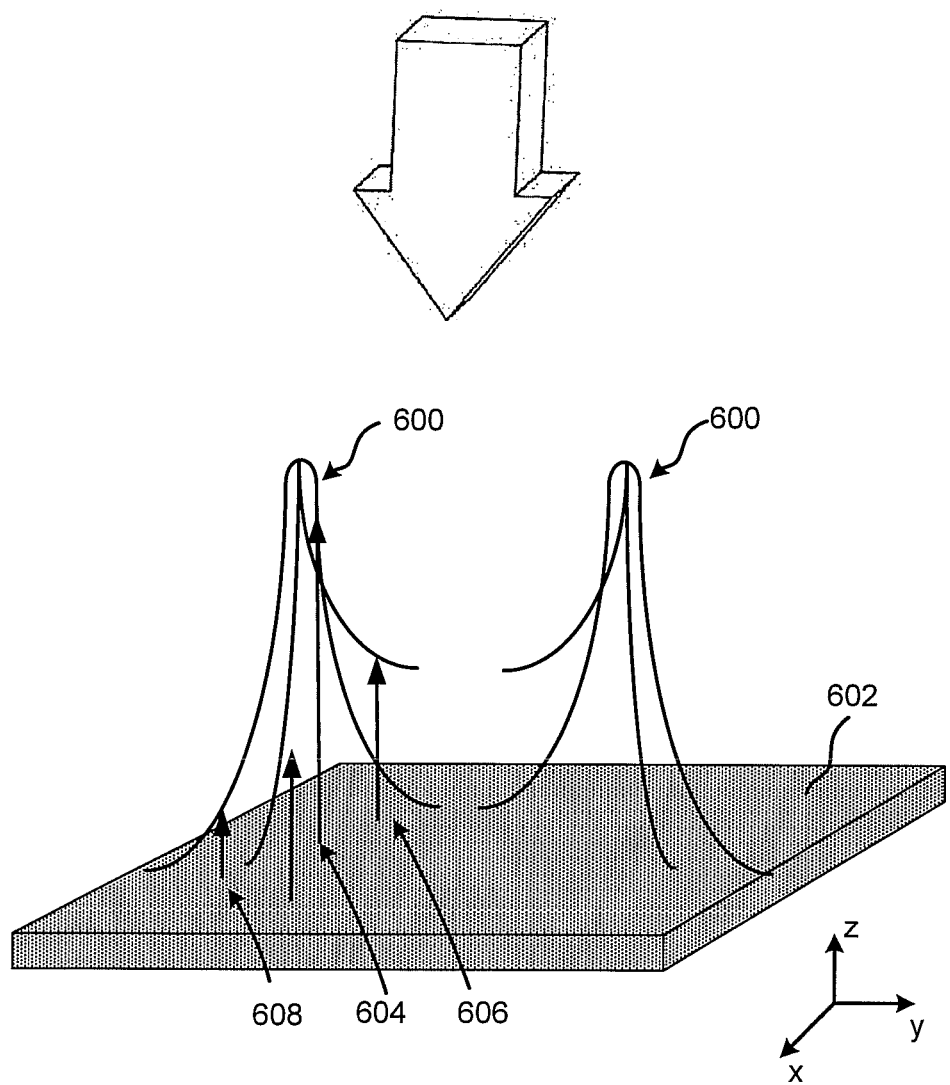
FIG. 6 shows an isometric view of an exemplary phase change contour map produced by a particular grating pattern of a SWG, according to an embodiment of the invention.

FIG. 6 shows an isometric view of an exemplary phase change contour maps 600 produced by a particular grating pattern of a SWG 602 in accordance with one or more embodiments of the present invention. The contour maps 600 represent the magnitudes of the phase changes acquired by light reflected from the SWG 602. In the example shown in FIG. 6, the grating pattern of the SWG 602 produces contour maps 600 with the largest magnitudes in the phases acquired by the light reflected around the center of the SWG 602, with the magnitudes of the phases acquired by reflected light decreasing toward the center of the SWG 602 as toward the edges of the SWG 602. For example, light reflected from a sub-pattern 604 acquires a phase of $\phi_1$, and light reflected from a sub-pattern 606 acquires a phase of $\phi 2$. Because $\phi_1$ is much larger than $\phi_2$, the light reflected from the sub-pattern 606 acquires a much larger phase than the light reflected from the sub-pattern 608. In addition, the sub-pattern 604 is configured to have a relatively higher reflection coefficient than the sub-pattern 606, and thus, the light reflected from those sub-patterns 604 and 606 will have different amplitudes, which results in the reflected light having a non-Gaussian spatial mode across the SWG 602.

The phase change in turn shapes the wavefront of light reflected from the SWG into a desired pattern. For example, as described above with reference to FIGS. 4 and 5, lines having a relatively larger duty cycle produce a larger phase shift in reflected light than lines having a relatively smaller duty cycle. As a result, a first portion of a wavefront reflected from lines having a first duty cycle lags behind a second portion of the same wavefront reflected from a different set of lines configured with a second relatively smaller duty cycle. Embodiments of the present invention include patterning the SWG to have sections of varying levels of reflectivity to control the phase change and ultimately the pattern of the reflected light.

Figure 7:
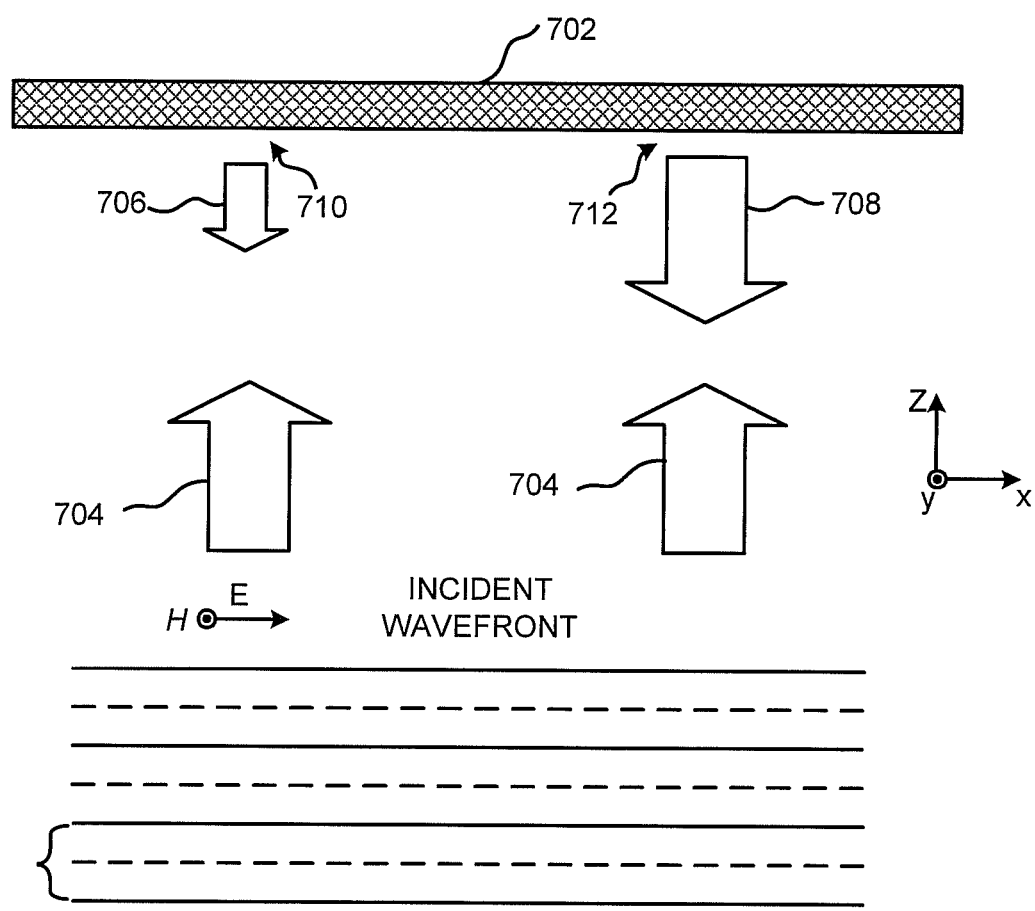
FIG. 7 shows a side view of a SWG configured with multiple sections having different reflection coefficients to cause light to be reflected to have a non-Gaussian pattern, according to an embodiment of the invention.

FIG. 7 shows a side view of a SWG 702 configured with multiple sections having different reflection coefficients to cause light to be reflected to have a non-Gaussian pattern in accordance with one or more embodiments of the present invention. As shown in FIG. 7, light in the incident wavefront has a first intensity as indicated by the size of the arrows 704. The light is reflected from a surface of the SWG 702 as indicated by the arrows 706 and 708. The arrows 706 and 708 have different sizes, which indicate that the first arrow 706 has a lower intensity level as compared with the second arrow 708. More particularly, a first section 710 of the SWG 702 is composed of a pattern of lines that are arranged and configured to have a relatively low reflection coefficient and a second section 712 of the SWG 702 is composed of a pattern of lines that are arranged and configured to have a relatively high reflection coefficient. In this regard, the light reflected from the surface of the SWG 702 has a non-Gaussian, spatial mode.

Configuring Non-Periodic Sub-Wavelength Gratings

Figure 8:
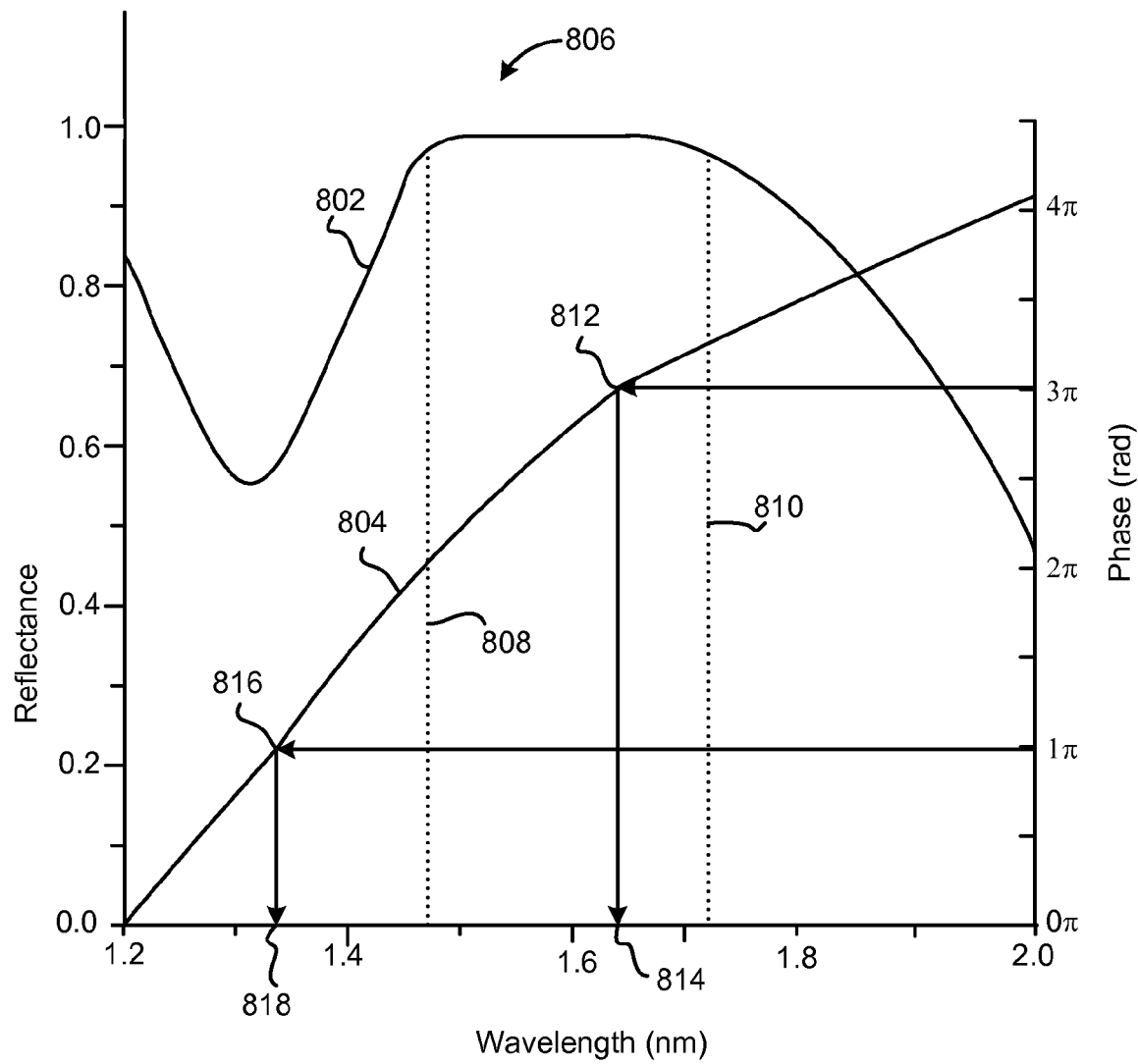
FIG. 8 shows a plot of reflectance and phase shift over a range of incident light wavelengths for an example SWG, according to an embodiment of the invention.

Embodiments of the present invention include a number of ways in which a SWG may be configured to operate as a mirror that introduces a desired pattern to the light reflected from the SWG. A first method of configuring a SWG to reflect light with a desired pattern includes determining a reflection coefficient profile for the grating layer of a SWG. The reflection coefficient is a complex valued function represented by:

$$r(\lambda) = \sqrt{R(\lambda)} e^{i\phi(\lambda)}$$

where $R(\lambda)$ is the reflectance of the SWG, and $\phi(\lambda)$ is the phase shift or phase change produced by the SWG. FIG. 8 shows a plot of reflectance and phase shift over a range of incident light wavelengths for an example SWG in accordance with one or more embodiments of the present invention. In this example, the grating layer is configured with a one-dimensional grating and is operated at normal incidence with the electric field component polarized perpendicular to the lines of the grating layer. In the example of FIG. 8, curve 802 corresponds to the reflectance $R(\lambda)$ and curve 804 corresponds to the phase shift $\phi(\lambda)$ produced by the SWG for the incident light over the wavelength range of approximately 1.2 μm to approximately 2.0 μm. The reflectance and phase curves 802 and 804 may be determined using either the well-known finite element method or rigorous coupled wave analysis. Due to the strong refractive index contrast between SWG and air, the SWG has a broad spectral region of high reflectivity 806. However, curve 804 reveals that the phase of the reflected light varies across the entire high-reflectivity spectral region between dashed-lines 808 and 810.

When the spatial dimensions of the period and width of the lines is changed uniformly by a factor α, the reflection coefficient profile remains substantially unchanged, but with the wavelength axis scaled by the factor α. In other words, when a grating has been designed with a particular reflection coefficient $R_0$ at a free space wavelength $\lambda_0$, a new grating with the same reflection coefficient at a different wavelength $\lambda$ may be designed by multiplying all the grating geometric parameters, such as the period, line thickness, and line width, by the factor $\alpha = \lambda/\lambda_0$, giving $r(\lambda) = r_0(\lambda/\alpha) = r_0(\lambda_0)$.

In addition, a grating may be designed with $|R(\lambda)| \to 1$, but with a spatially varying phase, by scaling the parameters of the original periodic grating non-uniformly within the high-reflectivity spectral window 806. Suppose that introducing a phase ø(x,y) on a portion of light reflected from a point on the SWG with transverse coordinates (x,y) is desired. Near the point (x,y), a non-uniform grating with a slowly varying grating scale factor a(x, y) behaves locally as though the grating was a periodic grating with a reflection coefficient $R_0(\lambda/\alpha)$. Thus, given a periodic grating design with a phase $\emptyset_0$, at some wavelength $\lambda_0$, choosing a local scale factor $\alpha(x,y) = \lambda/\lambda_0$ gives ø(x,y)=$\emptyset_0$ at the operating wavelength $\lambda$. For example, suppose that introducing a phase of approximately 3π on a portion of the light reflected from a point (x,y) on a SWG design is desired, but the line width and period selected for the point (x,y) introduces a phase of approximately π. Referring again to the plot in FIG. 8, the desired phase $\emptyset_0=3\pi$ corresponds to the point 812 on the curve 804 and the wavelength $\lambda_0 \approx 1.67$ μm 814, and the phase 7 associated with the point (x,y) corresponds to the point 816 on the curve 804 and the wavelength $\lambda_0 \approx 1.34$ μm. Thus the scale factor is $\alpha(x, y) = \lambda/\lambda_0 = 1.34/1.67 = 0.802$, and the line width and period at the point (x,y) may be adjusted by multiplying by the factor α in order to obtain the desired phase $\emptyset_0=3\pi$ at the operating wavelength $\lambda=1.34$ μm.

Figure 9:
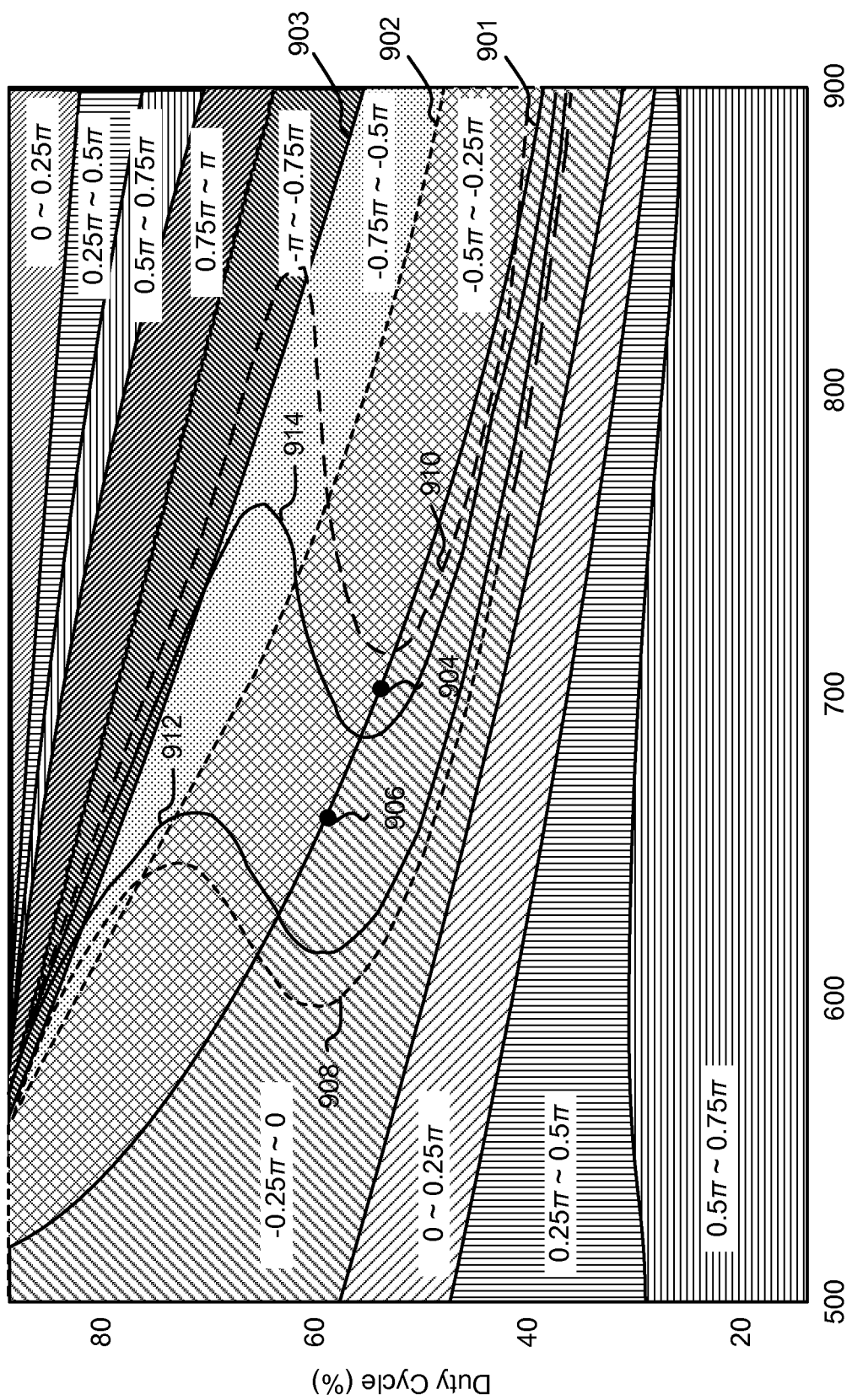
FIG. 9 shows a phase contour plot of phase variation as a function of period and duty cycle that may be used to configure a SWG, according to an embodiment of the invention.

The plot of reflectance and phase shift versus a range of wavelengths shown in FIG. 8 represents one way in which parameters of a SWG, such as line width, line thickness and period, can be determined in order to introduce a particular phase to light reflected from a particular point of the SWG. In other embodiments, phase variation as a function of period and duty cycle can be used to construct a SWG. FIG. 9 shows a phase contour plot of phase variation as a function of period and duty cycle that may be used to configure a SWG in accordance with one or more embodiments of the present invention. The contour plot shown in FIG. 9 may be produced using either the well known finite element method or rigorous coupled wave analysis. Contour lines, such as contour lines 901-903, each correspond to a particular phase acquired by light reflected from a grating pattern with a period and duty cycle lying anywhere along the contour. The phase contours are separated by 0.25π rad. For example, contour 901 corresponds periods and duty cycles that apply a phase of −0.25π rad to reflected light, and contour 902 corresponds to periods and duty cycles that apply a phase of −0.5π rad to reflected light. Phases between −0.25π rad and −0.5π rad are applied to light reflected from a SWG with periods and duty cycles that lie between contours 901 and 902. A first point (p,η) 904, corresponding to a grating period of 700 nm and 54% duty cycle, and a second point (p,η) 906, corresponding to a grating period of 660 nm and 60% duty cycle, both lie on the contour 901 and produce the same phase shift −0.25π but with different duty cycles and line period spacing.

FIG. 9 also includes two reflectivity contours for 95% and 98% reflectivity overlain on the phase contour surface. Dashed-line contours 908 and 910 correspond to 95% reflectivity, and solid line contours 912 and 914 correspond to 98% reflectivity. Points (p,η,φ) that lie anywhere between the contours 908 and 910 have a minimum reflectivity of 95%, and points (p,η,ø) that lie anywhere between the contours 912 and 914 have a minimum reflectivity of 98%.

The points (p,η,ø) represented by the phase contour plot may be used to select periods and duty cycles for a grating that can be operated as a particular type of mirror with a minimum reflectivity, as described below in the next subsection. In other words, the data represented in the phase contour plot of FIG. 9 may be used to design SWG optical devices. In certain embodiments, the period or duty cycle can be fixed while the other parameter is varied to design and fabricate SWGs. In other embodiments, both the period and duty cycle can be varied to design and fabricate SWGs.

Laser Operation and Cavity Configurations

FIGS. 10A-10B show cross-sectional views of the resonant cavity of the VCSEL 100 operated in accordance with one or more embodiments of the present invention. As shown in FIG. 10A, the electrodes 114 and 108 are coupled to a voltage source 1002 used to electronically pump the light-emitting layer 102. FIG. 10A includes an enlargement 1004 of a portion of a SWG 122, the air gap 216, a portion of the light-emitting layer 102, and a portion of the DBR 104. When no bias is applied to the VCSEL 100, the QWs 210 have a relatively low concentration of electrons in corresponding conduction bands and a relatively low concentration of vacant electronic states, or holes, in corresponding valence bands and substantially no light is emitted from the light-emitting layer 102. On the other hand, when a forward-bias is applied across the layers of the VCSEL array 100, electrons are injected into the conduction bands of the QWs 210 while holes are injected into the valence bands of the QWs 210, creating excess conduction band electrons and excess valence band holes in a process called population inversion. The electrons in the conduction band spontaneously recombine with holes in the valence band in a radiative process called "electron-hole recombination" or "recombination." When electrons and holes recombine, light is initially emitted in all directions over a range of wavelengths. As long as an appropriate operating voltage is applied in the forward-bias direction, electron and hole population inversion is maintained at the QWs 210 and electrons can spontaneously recombine with holes, emitting light in nearly all directions.

As described above, the SWG 122 and the DBR 104 may be configured to form a cavity that reflects light emitted substantially normal to the light-emitting layer 102 and over a narrow range of wavelengths back into the light-emitting layer 102, as indicated by directional arrows 1006. The light reflected back into the QWs 210 stimulates the emission of more light from the QWs 210 in a chain reaction. Note that although the light-emitting layer 102 initially emits light over a range of wavelengths via spontaneous emission, the SWG 122 is configured to select a wavelength, λ, to reflect back into the light-emitting layer 102 causing stimulated emission. This wavelength is referred to as the longitudinal, axial, or z-axis mode. Over time, the gain in the light emitting layer 102 becomes saturated by the longitudinal mode and the longitudinal mode begins to dominate the light emissions from the light-emitting layer 102 and other longitudinal modes decay. In other words, light that is not reflected back and forth between the SWG 122 and the DBR 104 leaks out of the VCSEL array 100 with no appreciable amplification and eventually decays as the longitudinal mode supported by the cavity begins to dominate. The dominant longitudinal mode reflected between the SWG 122 and the DBR 104 is amplified as it sweeps back and forth across the light emitting layer 102 producing standing waves 1008 that terminate within the SWG 122 and extend into the DBR 104, as shown in FIG. 10B. Ultimately, a substantially coherent beam of light 1010 with the wavelength λ emerges from the SWG 122. Light emitted from the light-emitting layer 102 penetrates the DBR 104 and the SWG 122 and adds a contribution to the round trip phase of the light in the cavity. As discussed above, because the SWG 122 comprises sections having different levels of reflectivity, the light is reflected from the SWG 122 with a particular pattern caused by the sections, and thus, the light beam 1010 emerging from the VCSEL 100 also has the particular pattern.

Figure 11:
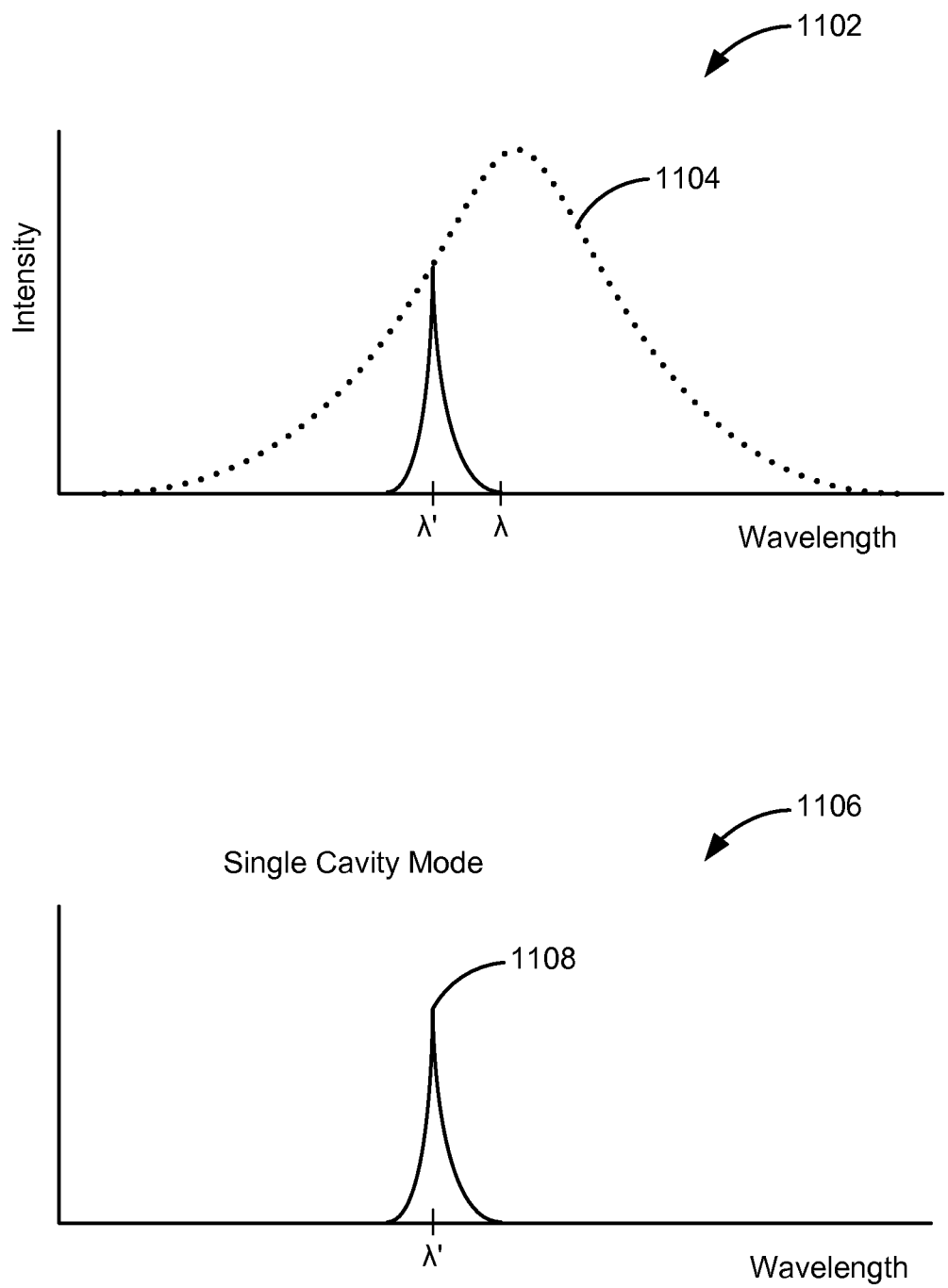
FIG. 11 shows an example plot of an intensity or gain profile of light emitted from the light-emitting layer centered about a wavelength $\lambda$ and an example plot of a single hypothetical cavity mode, according to an embodiment of the invention.

The cavity created by the DBR 104 and the SWG 122 may be configured to support a single longitudinal or z-axis cavity mode with a particular wavelength λ'. For example, returning to FIG. 8, the high reflectivity portion 806 of the reflectance curve 802 represents a narrow band of wavelengths that can be reflected by the SWG 122. FIG. 11 shows an example plot 1102 of an intensity or gain profile 1104 of light emitted from the light-emitting layer 102 centered about a wavelength λ and an example plot 1106 of a single hypothetical cavity mode in accordance with one or more embodiments of the present invention. The peak 1108 in the plot 1106 is associated with a single longitudinal cavity mode A' supported by the cavity formed by the SWG 122 and the DBR 104. The light-emitting layer 102 makes available a range of wavelengths represented by the intensity profile 1104 out of which the cavity selects the longitudinal mode with the wavelength, λ', represented by peak 1110, which is amplified within the cavity and emitted from the VCSEL 100.

Figure 12:
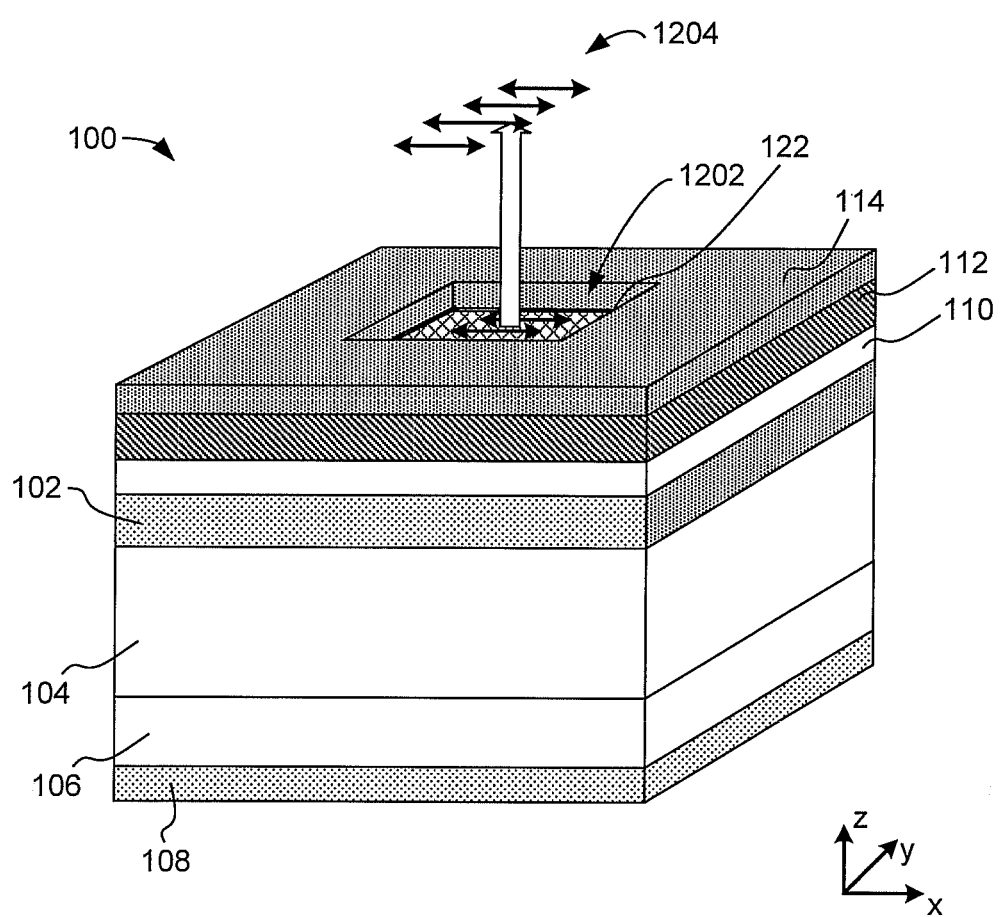
FIG. 12 shows an example of polarized light emitted from the VCSEL, according to an embodiment of the invention.

FIG. 12 shows an example of polarized light emitted from the VCSEL 100 in accordance with one or more embodiments of the present invention. Light emitted from the light-emitting layer 102 is unpolarized. However, over time, as the gain saturates, a polarization state is selected by the SWG 122. Double-headed arrows 1202 incident on the SWG 122 from within the VCSEL 100 represent a polarization state selected by the SWG 122 light. SWG 122 can be configured as described above with lines and grooves running parallel to the y-direction. In the example of FIG. 12, the SWG 122 selects only the component of the light emitted from the light-emitting layer 102 that is polarized in the x-direction. The polarized light is amplified within the cavity formed by the SWG 122 and the DBR 104 as described above. As shown in the example of FIG. 12, the light emitted from VCSEL 100 is polarized in the x-direction, as represented by double-headed arrows 1204.

In addition to supporting particular longitudinal or axial modes of oscillation, which correspond to standing waves supported by the cavity along the z-axis, transverse modes can be supported as well. Transverse modes are normal to the cavity or z-axis and are known as $TEM_{nm}$ modes, where m and n subscripts are the integer number of transverse nodal lines in the x- and y-directions across the emerging beam. In other words, the beam formed within the cavity can be segmented in its cross section into one or more regions. A SWG can be configured to only support one or certain transverse modes.

Figure 13A:
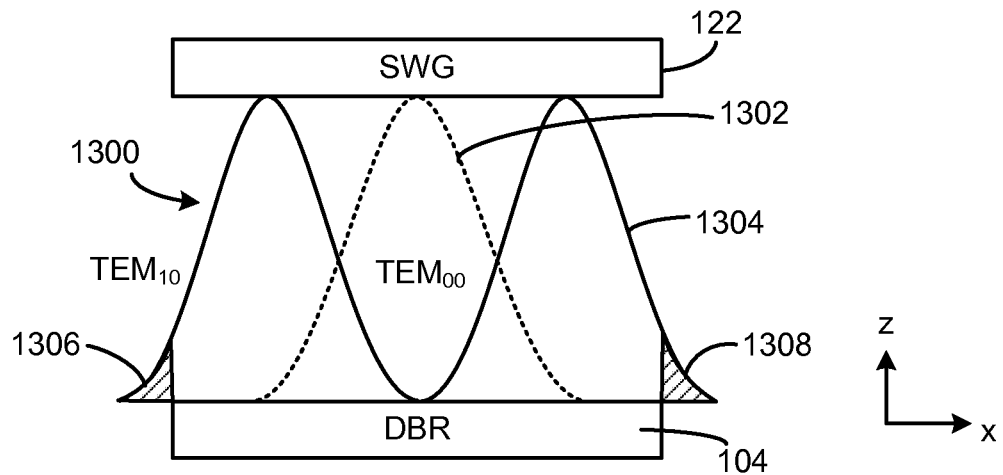
FIG. 13A shows an example of two transverse modes created in a cavity formed by the SWG and the DBR of the VCSEL depicted in FIG. 1A, according to an embodiment of the invention.

FIG. 13A shows an example of two transverse modes created in a cavity 1302 formed by the SWG 122 and the DBR 104 in accordance with one or more embodiments of the present invention. As described above, the SWG 122 may be configured to define the size of the cavity. As shown in FIG. 13A, the $TEM_{00}$ mode, is represented by dotted curve 1302 and the $TEM_{10}$ mode is represented by solid curve 1304. The $TEM_{00}$ mode has no nodes and lies entirely within the cavity 1300. On the other hand, the $TEM_{10}$ mode has one node along the x-direction and portions 1306 and 1308 lie outside the cavity 1300. As a result, during gain saturation, because the $TEM_{00}$ mode lies entirely within the cavity 1300, $TEM_{00}$ mode is amplified. However, because portions of the $TEM_{10}$ mode lie outside the cavity 1300, the $TEM_{10}$ mode decreases during gain saturation and eventually decays, while the $TEM_{00}$ mode continues to amplify. Other $TEM_{mn}$ modes that cannot be supported by, or lie entirely within, the cavity 1300 also decay.

Figure 13B:
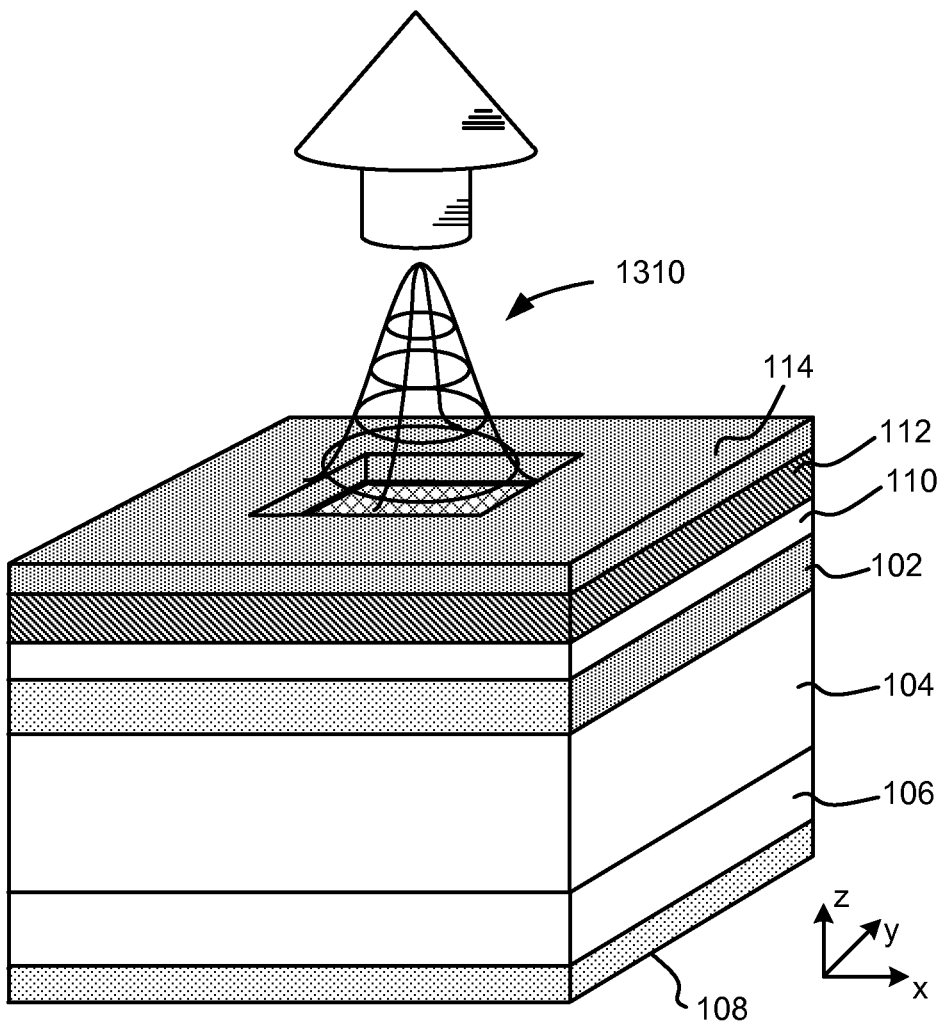
FIG. 13B shows a contour plot of the intensity profile distribution of $TEM_{00}$ emitted from the VCSEL depicted in FIG. 1A, according to an embodiment of the invention.

FIG. 13B shows a contour plot 1310 of the intensity profile distribution of $TEM_{00}$ emitted from the VCSEL 100 in accordance with one or more embodiments of the present invention. In the embodiment represented in FIG. 13B, the $TEM_{00}$ emerges from the SWG 122 with a nearly planar coherent wavefront and with a Gaussian transverse irradiance profile represented by the contour plot 1310. The intensity profile is symmetrical about the z-axis. The external $TEM_{00}$ mode corresponds to an internal $TEM_{00}$ mode produced by the SWG 122 configured to operate as a spherical mirror, although other patterns in the reflected light may be generated. In other embodiments, the SWG 122 can be configured to operate as a cylindrical mirror that produces a lowest order transverse mode $TEM_{00}$ that is narrow in the direction perpendicular to the lines of the SWG 122 (the x-direction) and broad in the direction parallel to the lines of the SWG 122 (the y-direction). The $TEM_{00}$ mode can be coupled into the core of an optical fiber by placing the fiber so that core of the fiber is located in close proximity to the SWG 122. The SWG 122 can also be configured to emit transverse modes that are suitable for coupling into hollow waveguides, such as the $EH_{11}$ mode.

Figure 14A:
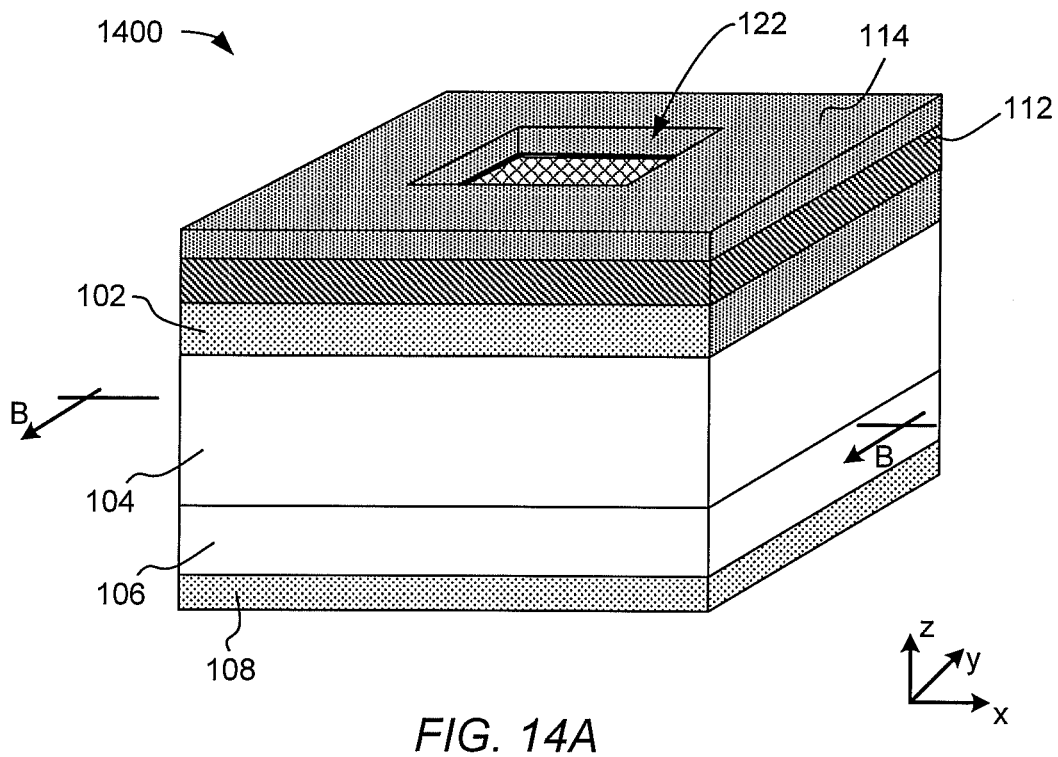
FIGS. 14A-14B, respectively, show an isometric and cross-sectional view along a line B-B of an example VCSEL, according to an embodiment of the invention.
Figure 14B:
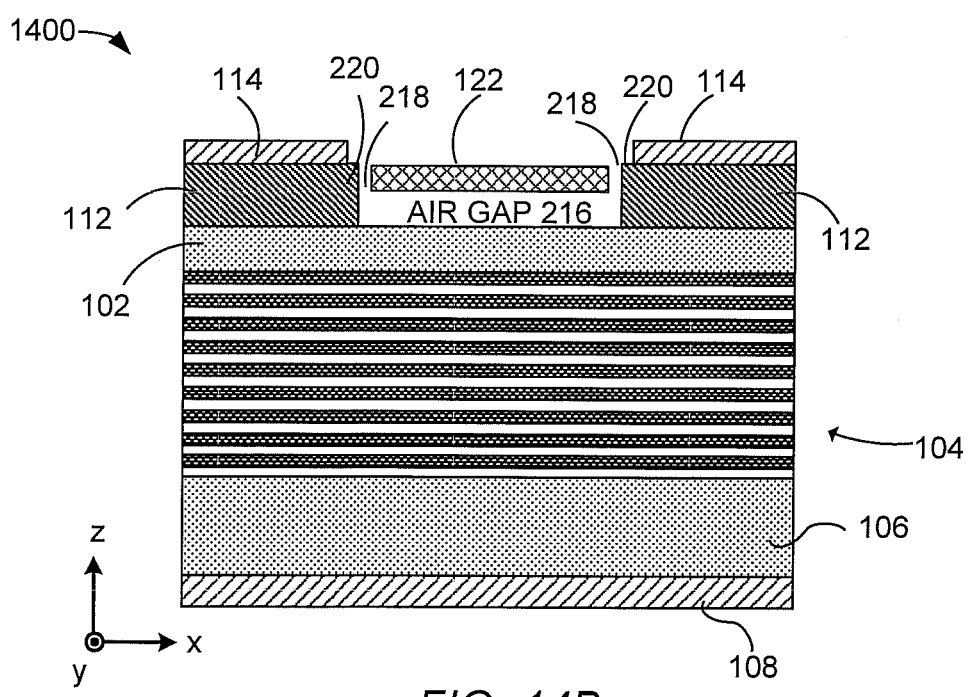

Returning to FIGS. 1A, 1B, and 2, the insulating layer 110 is configured to provide current and optical confinement. However, VCSEL embodiments of the present invention are not limited to having the insulating layer 110 because the SWG may be configured to confine reflected light to a region of the light-emitting layer located between the SWG and the DBR, as described above with reference to FIG. 10A. FIGS. 14A-14B show an isometric and cross-sectional view along a line B-B of an example VCSEL 1400 configured in accordance with one or more embodiments of the present invention. The VCSEL 1400 has a nearly identical configuration as the VCSEL 100 except the insulting layer 110 of the VCSEL 100 is not present in the VCSEL 1400. Instead, the SWG 122 of the grating layer 112 is configured to direct reflected light into a region of the light-emitting layer located between the SWG 122 and the DBR 104.

Figure 15A:
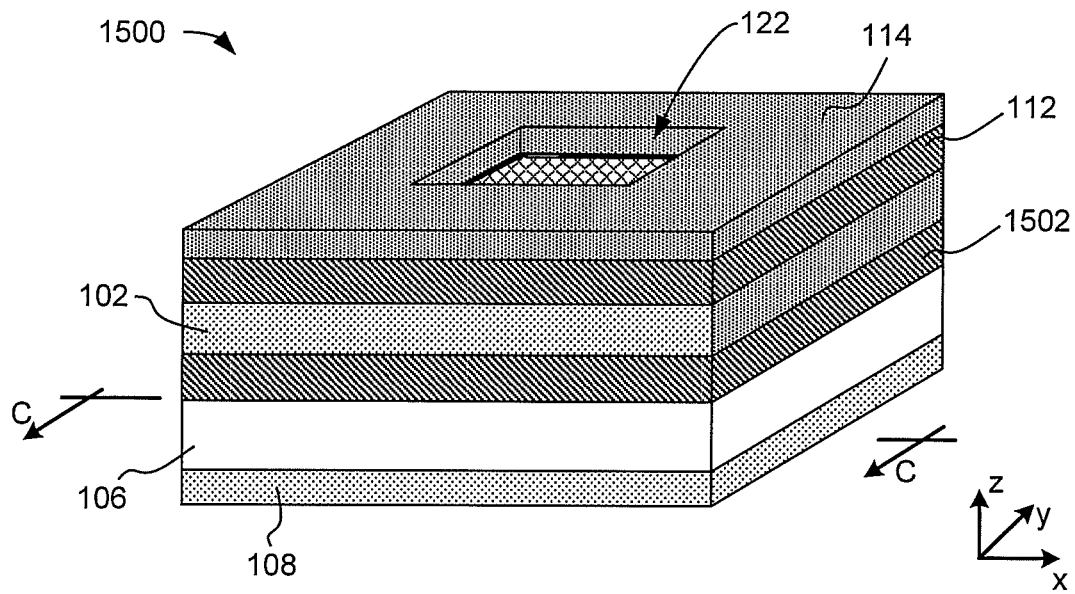
FIGS. 15A-15B, respectively, show an isometric and cross-sectional view along a line C-C of an example VCSEL, according to an embodiment of the invention.
Figure 15B:
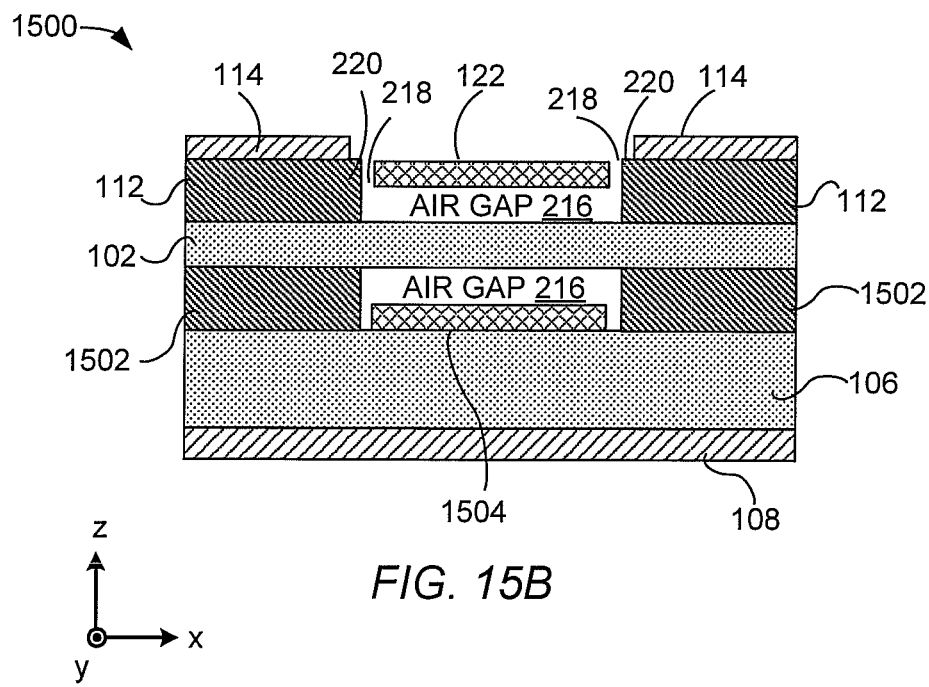

In still other embodiments of the present invention, both DBR layers of a typical VCSEL may be replaced by SWGs. FIGS. 15A-15B show an isometric and cross-sectional view along a line C-C of an example VCSEL 1500 configured in accordance with one or more embodiments of the present invention. The VCSEL 1500 has a nearly identical configuration as the VCSEL 100 except the DBR 104 is replaced by a second grating layer 1502 with a SWG 1504. As shown in FIG. 15B, the SWG 1504 is a suspended membrane with an air gap between the membrane and the light emitting layer 102. The SWG 1504 may be configured with either a one-dimensional or two-dimensional grating pattern to operate in the same manner as the SWG 122 described above. Alternatively, however, the SWG 1504 may be configured to have a relatively high reflectance coefficient throughout the surface of the SWG 1504. In any regard, the SWGs 122 and 1504 may be configured to direct reflected light into a region of the light-emitting layer 102, potentially eliminating the need for insulating layer 110.

Figure 16:
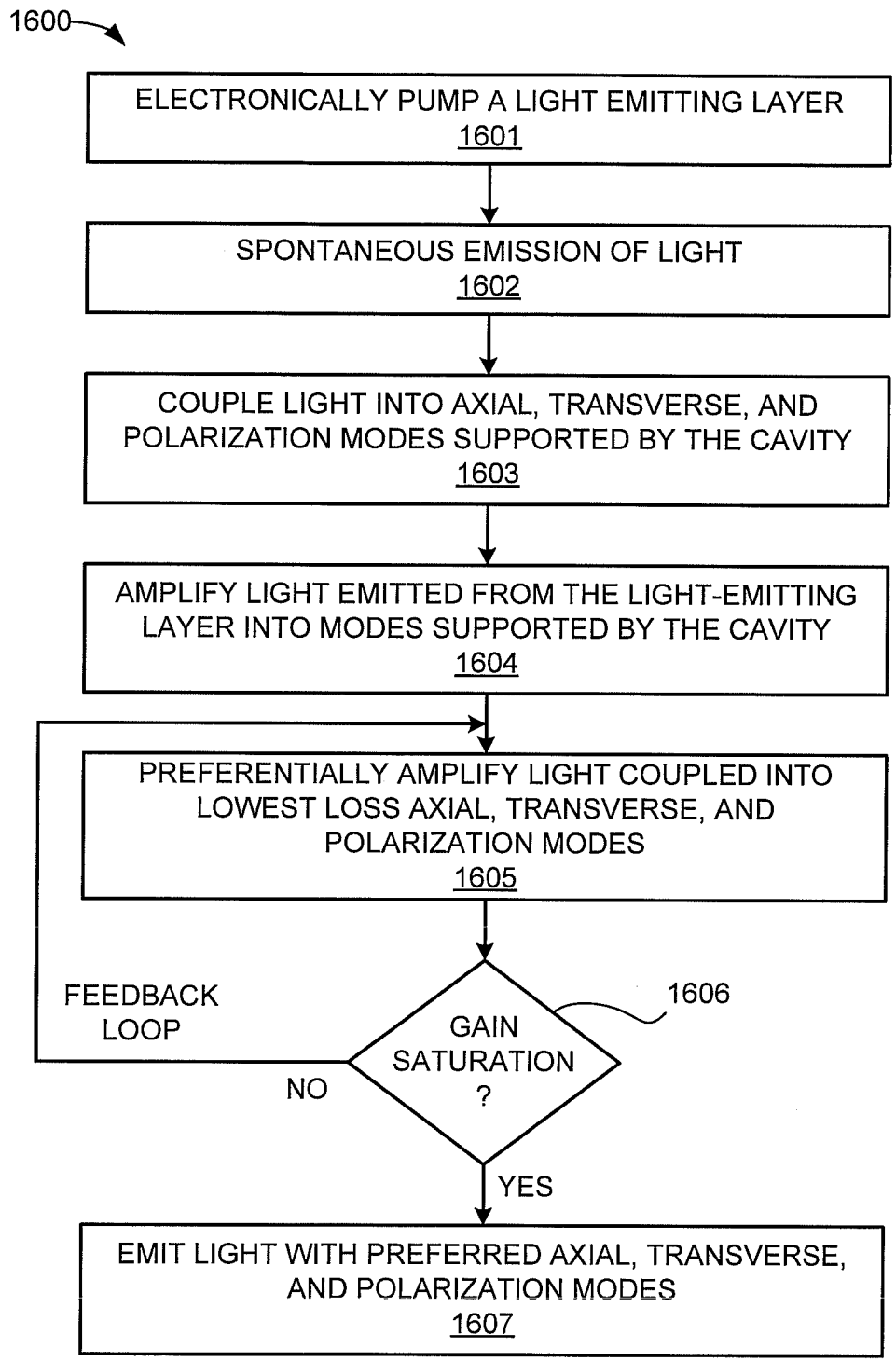
FIG. 16 shows a control-flow diagram of a method for generating light, according to an embodiment of the invention.

FIG. 16 shows a control-flow diagram of a method 1600 for generating light in accordance with one or more embodiments of the present invention. At step 1601, a light-emitting layer disposed within a resonant cavity formed by a SWG/DBR or SWG/SWG cavity is electronically pumped as described above with reference to FIG. 10A. At step 1602, light is spontaneously emitted from the light-emitting layer in all directions. At step 1603, the spontaneously emitted light supported by the cavity is coupled into the cavity. At step 1604, the spontaneously emitted light supported by the cavity stimulates the emission of light within the cavity. As a result, the light within the cavity begins to amplify. At step 1605, stimulated light coupled into the lowest loss axial, transverse, and polarization modes is preferentially amplified by the SWG layer. At step 1606, as long as gain saturation has not been achieved, axial, transverse, and polarization modes with the lowest loss are amplified within the cavity; otherwise, at step 1607, light with the preferred axial, transverse, and polarization modes are emitted from the cavity.

Figure 17:
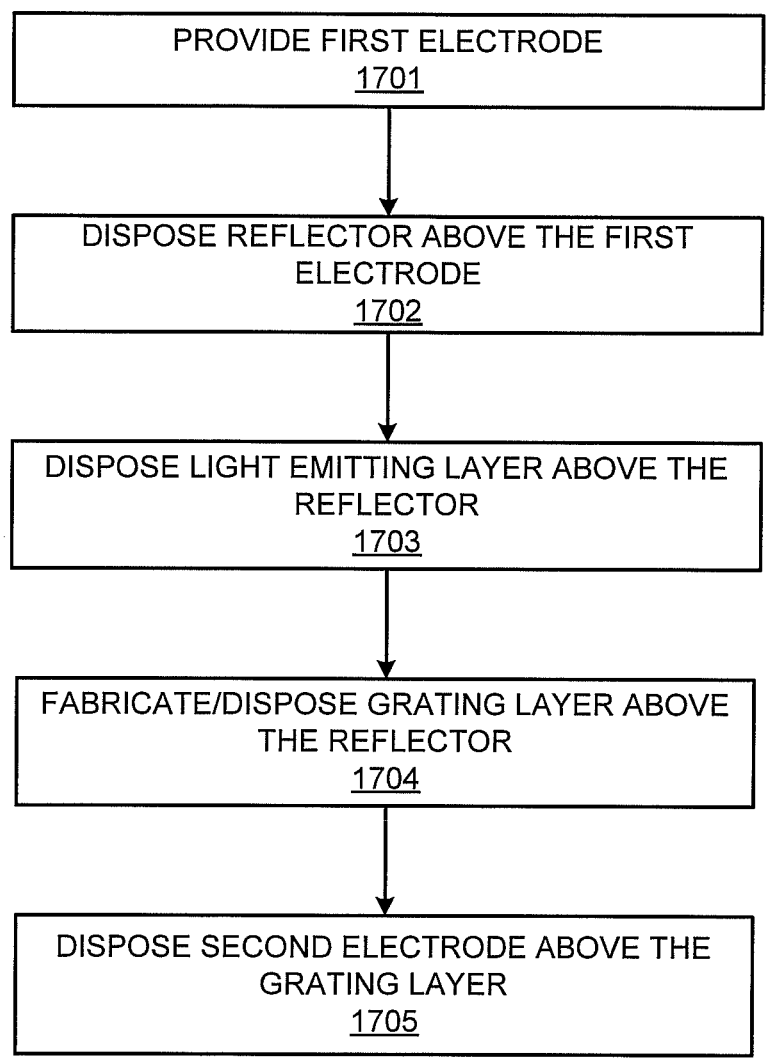
FIG. 17 shows a flow diagram of a method 1700 of fabricating a VCSEL, according to an embodiment of the invention.

Turning now to FIG. 17, there is shown a flow diagram of a method 1700 of fabricating a VCSEL 100 in accordance with one or more embodiments of the present invention. At step 1701, a first electrode 108 is provided, for instance, as shown in FIG. 1A. At step 1702, a reflector 104 (FIG. 1A) or 1502 (FIG. 15) is disposed above the first electrode 108. As shown in FIG. 1A, for instance, a substrate 106 may be positioned between the first electrode 108 and the reflector 104, 1502. In other embodiments, the first electrode 108 and the substrate 106 may be formed of a single element.

At step 1703, a light emitting layer 102 is disposed above the reflector 104, 1502, for instance, as also shown in FIG. 1A. At step 1704, a grating layer 112 is fabricated and disposed above the reflector 104, 1502, such that an air gap 216 exists as shown in FIG. 2. As discussed above, the grating layer 112 is configured with a non-periodic, SWG, 122, in which the non-periodic, SWG 122 includes at least one section 710 (FIG. 7) composed of a pattern configured to have a relatively low reflection coefficient and at least one section 712 (FIG. 7) composed of a pattern configured to have a relatively high reflection coefficient to cause light to be reflected in a predetermined, non-Gaussian, spatial mode across the sub-wavelength grating.

In addition, the SWG 122 may be fabricated either prior to or during disposition of the grating layer 112 over the reflector 104, 1502. According to one or more embodiments, the SWG 122 is fabricated by determining a desired pattern of light to be reflected from the grating layer, the desired pattern of light having varying levels of intensities, determining line widths, line period spacings, and line thicknesses for the grating layer corresponding to the desired pattern across the grating layer, and fabricating the grating layer to have a plurality of lines having the determined line widths, line period spacings, and line thicknesses. One or more of the steps in fabricating the SWG 122 may be performed by a computing device. For instance, the computing device may calculate the line widths, line period spacings, and line thicknesses for the grating layer corresponding to the desired pattern across the grating layer and may also control a micro-chip design tool (not shown) configured fabricate the SWG 122. Examples of various manners in which the computing device may determine the target phase changes across each of the SWGs 122 are described in the copending PCT Application No. PCT/US2009/051026.

According to an example, the micro-chip design tool is configured to pattern the lines of the SWGs 122 directly on a first layer of material. According to another example, the micro-chip design tool is configured to define a grating pattern of the lines in an imprint mold, which may be used to imprint the lines into a first layer positioned on the surface of a material from which the SWG 122 is fabricated. In this example, the imprint mold may be implemented to stamp the pattern of the lines into the first layer.

Figure 18:
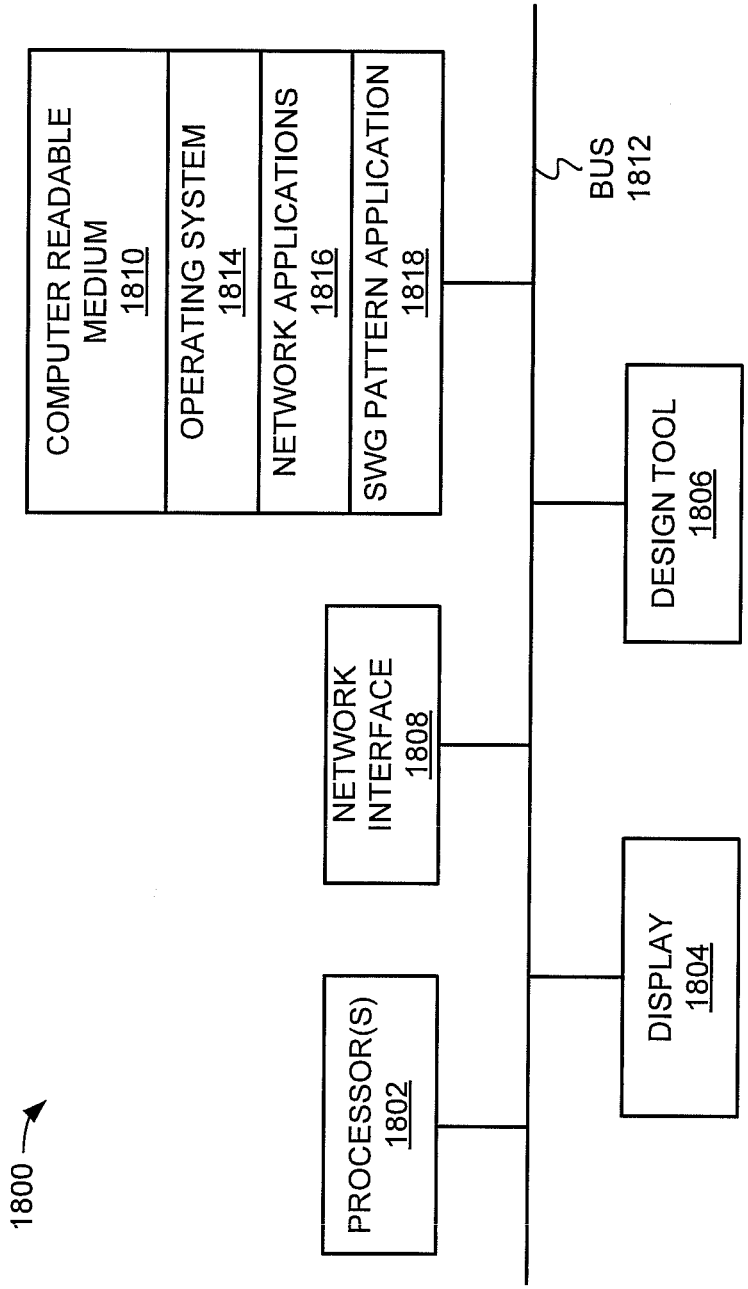
FIG. 18 shows a schematic representation of a computing device configured in accordance with embodiments of the present invention.

The methods employed to fabricate the SWG 122 grating pattern data of the grating layer 112 with reference to FIG. 17 may thus be implemented by the computing device, which may be a desktop computer, laptop, server, etc. Turning now to FIG. 18, there is shown a schematic representation of a computing device 1800 configured in accordance with embodiments of the present invention. The device 1800 includes one or more processors 1802, such as a central processing unit; one or more display devices 1804, such as a monitor; a design tool interface 1806; one or more network interfaces 1808, such as a Local Area Network LAN, a wireless 802.11x LAN, a 3G mobile WAN or a WiMax WAN; and one or more computer-readable mediums 1810. Each of these components is operatively coupled to one or more buses 1812. For example, the bus 1812 may be an EISA, a PCI, a USB, a FireWire, a NuBus, or a PDS.

The computer readable medium 1810 may be any suitable medium that participates in providing instructions to the processor 1802 for execution. For example, the computer readable medium 1810 may be non-volatile media, such as an optical or a magnetic disk; volatile media, such as memory; and transmission media, such as coaxial cables, copper wire, and fiber optics. Transmission media can also take the form of acoustic, light, or radio frequency waves. The computer readable medium 1810 may also store other software applications, including word processors, browsers, email, Instant Messaging, media players, and telephony software.

The computer-readable medium 1810 may also store an operating system 1814, such as Mac OS, MS Windows, Unix, or Linux; network applications 1816; and a grating application 1818. The operating system 1814 may be multi-user, multiprocessing, multitasking, multithreading, real-time and the like. The operating system 1814 may also perform basic tasks such as recognizing input from input devices, such as a keyboard or a keypad; sending output to the display 1804 and the design tool 1806; keeping track of files and directories on medium 1810; controlling peripheral devices, such as disk drives, printers, image capture device; and managing traffic on the one or more buses 1812. The network applications 1816 includes various components for establishing and maintaining network connections, such as software for implementing communication protocols including TCP/IP, HTTP, Ethernet, USB, and FireWire.

The SWG pattern application 1818 provides various software components for generating grating pattern data, as described above. In certain embodiments, some or all of the processes performed by the application 1818 may be integrated into the operating system 1814. In certain embodiments, the processes can be at least partially implemented in digital electronic circuitry, or in computer hardware, firmware, software, or in any combination thereof.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A vertical-cavity surface-emitting laser comprising:
   a grating layer having a non-periodic, sub-wavelength grating, wherein the non-periodic, sub-wavelength grating comprises a first section composed of a plurality of first elements arranged in a first pattern and a second section composed of a plurality of second elements arranged in a second pattern, wherein the first section is physically separated from the second section, and wherein the first section has a first reflection coefficient and the second section has a second reflection coefficient that is higher than the first reflection coefficient to cause light to be reflected in a predetermined, non-Gaussian, spatial mode across the sub-wavelength grating;
   a reflective layer; and
   a light emitting layer disposed between the grating layer and the reflector, wherein the sub-wavelength grating and the reflector form a resonant cavity, and wherein the sub-wavelength grating and the reflector are to cause light having a predetermined pattern to be emitted from the vertical-cavity surface-emitting laser.

2. The vertical-cavity surface-emitting laser according to claim 1, wherein the plurality of first elements of the first section are to reflect light at a much reduced intensity level as compared with the plurality of second elements of the second section.

3. The vertical-cavity surface-emitting laser according to claim 2, wherein the reflectivity of the plurality of first elements of the first section is between about 50-70%.

4. The vertical-cavity surface-emitting laser according to claim 2, wherein the reflectivity of the plurality of second elements of the second section is about 99%.

5. The vertical-cavity surface-emitting laser according to claim 1, further comprising:
   a substrate disposed below the reflective layer;
   a first electrode disposed below the substrate; and
   a second electrode disposed on the grating layer, the second electrode having an opening exposing the sub-wavelength grating.

6. The vertical-cavity surface-emitting laser according to claim 1, wherein the reflective layer further comprises a distributed Bragg reflector.

7. The vertical-cavity surface-emitting laser according to claim 1, wherein the reflective layer further comprises a second grating layer configured with a second non-periodic, sub-wavelength grating.

8. The vertical-cavity surface-emitting laser according to claim 1, wherein each of the first elements and the second elements comprises lines separated by grooves and wherein the first elements comprise widths that differ from the widths of the second elements.

9. The vertical-cavity surface-emitting laser according to claim 1, wherein the first elements are arranged to a have a first period and duty cycle with respect to each other and the second elements are arranged to have a second period and duty cycle with respect to each other, and wherein the first period and duty cycle differs from the second period and duty cycle.

10. The vertical-cavity surface-emitting laser according to claim 1, wherein each of the first elements and the second elements are arranged in a two-dimensional pattern.

11. The vertical-cavity surface-emitting laser according to claim 1, wherein the sub-wavelength grating further comprises a membrane suspended on one or more edges to form an air gap between the sub-wavelength grating and the light-emitting layer.

12. The vertical-cavity surface-emitting laser according to claim 1, further comprising:
   an insulating layer disposed between the light-emitting layer and the grating layer, the insulating layer including an opening for current and optical confinement.

13. The vertical-cavity surface-emitting laser according to claim 1, wherein the plurality of first elements and the plurality of second elements are to polarize light amplified within and emitted from the resonant cavity.

14. The vertical-cavity surface-emitting laser according to claim 1, wherein the sub-wavelength grating and the reflector form a single mode resonant cavity to emit a single mode of light.

15. A method for generating light, the method comprising:
   electronically pumping a light-emitting layer to emit light within a resonant cavity formed within a surface-emitting laser, said surface-emitting laser including a grating layer having a non-periodic, sub-wavelength grating formed of a first section composed of a plurality of first elements arranged in a first pattern and a second section composed of a plurality of second elements arranged in a second pattern, wherein the first section is physically separated from the second section, and wherein the first section has a first reflection coefficient and the second section has a second reflection coefficient that is higher than the first reflection coefficient to cause light to be reflected in a predetermined, non-Gaussian, spatial mode across the sub-wavelength grating;
   coupling light into axial modes transversely supported by the cavity, wherein the light is preferentially amplified within the cavity based on configurations of the first and second elements; and wherein a mode of coherent beam of light having the predetermined spatial mode that match axial and transverse modes supported by the cavity is emitted.

16. The method according to claim 15, wherein a single mode of light supported by the cavity is emitted.

17. The method according to claim 15, wherein the first elements and the second elements are to preferentially amplify modes of light with a particular polarization supported by the cavity.

18. The method according to claim 17, wherein the first elements and the second elements are to reflect light with a particular polarization.

19. A method for fabricating a vertical-cavity surface-emitting laser, said method comprising:
   providing a first electrode;
   disposing a reflector above the first electrode;
   disposing a light emitting layer above the reflector;
   disposing a grating layer above the light emitting layer, said grating layer having a non-periodic, sub-wavelength grating, wherein the non-periodic, sub-wavelength grating comprises a first section composed of a plurality of first elements arranged in a first pattern and a second section composed of a plurality of second elements arranged in a second pattern, wherein the first section is physically separated from the second section, and wherein the first section has a first reflection coefficient and the second section has a second reflection coefficient that is higher than the first reflection coefficient to cause light to be reflected in a predetermined, non-Gaussian, spatial mode across the sub-wavelength grating; and disposing a second electrode above the grating layer.

20. The method according to claim 19, further comprising:
fabricating the sub-wavelength grating one of prior to and during disposition of the grating layer over the reflector, wherein fabricating the sub-wavelength grating comprises:
   determining a desired pattern of light to be reflected from the grating layer, said desired pattern of light having varying levels of intensities;
   determining widths, period spacings, and thicknesses for the first elements and the second elements; and
   fabricating the grating layer to have the plurality of first elements and second elements having the determined widths, period spacings, and thicknesses.

* * * * *

UNITED STATES PATENT AND TRADEMARK OFFICE
CERTIFICATE OF CORRECTION

PATENT NO.         : 8,576,890 B2                    Page 1 of 1
APPLICATION NO.    : 12/767474
DATED              : November 5, 2013
INVENTOR(S)        : David A. Fattal et al.

It is certified that error appears in the above-identified patent and that said Letters Patent is hereby corrected as shown below:

In the Claims

In column 16, line 22, in Claim 9, delete "a have" and insert -- have --, therefor.

Signed and Sealed this
First Day of April, 2014

Michelle K. Lee
*Deputy Director of the United States Patent and Trademark Office*